(12) United States Patent
Nagata

(10) Patent No.: US 9,036,448 B2
(45) Date of Patent: May 19, 2015

(54) SEMICONDUCTOR DEVICE

(75) Inventor: Kyoichi Nagata, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 570 days.

(21) Appl. No.: 13/415,777

(22) Filed: Mar. 8, 2012

(65) Prior Publication Data

US 2012/0230144 A1  Sep. 13, 2012

(30) Foreign Application Priority Data

Mar. 11, 2011 (JP) .................................. 2011-053708

(51) Int. Cl.
*G11C 8/18* (2006.01)
*H03K 21/40* (2006.01)

(52) U.S. Cl.
CPC ................ *G11C 8/18* (2013.01); *H03K 21/406* (2013.01)

(58) Field of Classification Search
CPC .................... G11C 7/22–7/225; G11C 7/1066; G11C 7/1077
USPC ........................... 365/193, 194, 233.1–233.13
See application file for complete search history.

(56) References Cited

U.S. PATENT DOCUMENTS

| 6,104,225 | A  | * | 8/2000  | Taguchi et al. | ............... 327/298 |
| 6,388,945 | B2 | * | 5/2002  | Aikawa  | .................... 365/233.11 |
| 6,643,215 | B2 |   | 11/2003 | Kwak    | |
| 7,227,809 | B2 | * | 6/2007  | Kwak    | ....................... 365/189.15 |
| 7,436,230 | B2 | * | 10/2008 | Kim     | ............................... 327/158 |

FOREIGN PATENT DOCUMENTS

JP      2001-283589 A      10/2001
JP      2002-230973 A       8/2002

* cited by examiner

*Primary Examiner* — Harry W Bryne
*Assistant Examiner* — Lance Reidlinger
(74) *Attorney, Agent, or Firm* — Kunzler Law Group, PC

(57) ABSTRACT

A device includes a first clock generation circuit that receives an external clock signal supplied to the device, delays the external clock signal to output a first clock signal synchronized with the external clock signal, and a circuit that generates a control signal to control output of data, based on second clock signals obtained by dividing an internal clock signal generated from the external clock signal, and third clock signals obtained by dividing the first clock signal.

20 Claims, 14 Drawing Sheets

FIG. 12 PROTOTYPE

SEMICONDUCTOR DEVICE

TECHNICAL FIELD

REFERENCE TO RELATED APPLICATION

This application is based upon and claims the benefit of the priority of Japanese patent application No. 2011-053708, filed on Mar. 11, 2011, the disclosure of which is incorporated herein in its entirety by reference thereto.

The present invention relates to a semiconductor device. More specifically, the invention relates to a semiconductor device configured to be suitable for controlling a timing of outputting data to outside the device.

BACKGROUND

In a synchronous semiconductor memory device, which is one of synchronous semiconductor devices, a signal representing a command or data supplied externally to the synchronous semiconductor memory device is captured into the synchronous semiconductor memory in synchronization with an external clock signal such as a system clock supplied externally to the synchronous semiconductor memory device. A signal representing data read from the synchronous semiconductor memory device is outputted in synchronization with the external clock signal. The synchronous semiconductor memory device includes an internal clock generation circuit that generates an internal clock signal, based on the received external clock signal. One of circuits that is arranged in the synchronous semiconductor memory device and is driven by a clock signal, operates in synchronization with the internal clock signal generated by the internal clock generation circuit. Due to a wiring delay in the semiconductor device or the like, a timing skew is generated between the internal clock signal and the external clock signal. For this reason, in the synchronous semiconductor memory device, a synchronizing circuit such as a DLL (Delay Lock Loop: delay lock loop) circuit is employed to synchronize the internal clock signal with the external clock signal. The DLL enables the output data which is synchronized with the internal clock signal to be outputted in synchronization with the external clock signal.

Patent Document 1 discloses a synchronous semiconductor memory device including a read information signal generation circuit, a delay circuit, and a latency control signal generation circuit. The delay circuit delays a read information signal (COSR) outputted from the read information signal generation circuit by one cycle of a first clock (PCK), in response to the first clock. The first clock is delayed from a system clock (CLK) applied from outside the synchronous semiconductor memory device just by a predetermined phase difference. The latency control signal generation circuit generates a latency control signal for determining a generation point of time of output data. The latency control signal is configured to sample the delayed read information signal (COSRD) during a first logic state segment (such as a High state segment) of a second clock (CLKDQ) in response to the second clock (CLKDQ) that advances from the system clock (CLK) by a predetermined phase difference, and then delay the sampled signal, thereby generating the latency control signal. FIG. 5 in Patent Document 1 discloses a method of sampling the delayed read information signal (COSRD) during a C2 cycle in order to ensure an operating margin (frequency margin and sampling margin of the system clock) when the output data read from a memory element in synchronization with the internal clock signal is timing-adjusted to data synchronized with the external clock signal. When the frequency of the system clock is further increased, a sufficient operating margin cannot be ensured in the circuit and the method described in Patent Document 1.

FIG. 12 is a diagram schematically showing the configuration of a prototype example of a synchronous semiconductor memory. Referring to FIG. 12, a memory cell array 70 includes a plurality of memory cells MC in an array form at intersections between word lines WL and bit lines BL. Though no particular limitation is imposed, it is assumed below that each memory cell MC is a DRAM (Dynamic Random Access Memory) cell. In this cell, a word line is connected to a gate of the memory cell MC, one of a source and a drain of the memory cell MC is connected to a bit line, the other of the source and the drain of the memory cell MC is connected to a capacitor, and data is held in the capacitor. The synchronous semiconductor memory may be of course an SRAM (Static Random Access Memory).

A row system control circuit 41 latches a row address of an address signal received at an address terminal, and supplies the latched row address to a row decoder 71 and generates row system control signals.

A column system control circuit 51 latches a column address of the address signal, and supplies the latched column address to a column decoder 73 and generates column system control signals.

The row decoder 71 decodes a row address signal to select a word line. The selected word line is driven by a word driver not shown.

In the case of the DRAM memory cell, each of sense amplifiers (SAs) 72 amplifies data read onto the bit line BL connected to the memory cell MC connected to the selected word line. When refreshing is performed, the sense amplifier further writes the data amplified into the memory cell MC to restore the data in the memory cell MC.

The column decoder 73 decodes the column address of the received address signal and connects the sense amplifier 72 of a selected column to an input/output line not shown (such as a local input/output line). In the prototype example shown in FIG. 12, as an input/output line (IO line) configuration, a hierarchical input/output line configuration is employed. This configuration includes local input/output lines, each of which is connected to the sense amplifier 72 selected via a column switch (not shown) which is turned on by She column decoder 73, and main input/output lines, each of which is provided in common to local input/output lines. Bach of the main input/output lines is connected to one selected LIO line through a switch that is turned on.

Each of data amplifiers 74 is connected between the main input/output line (MIO) and a read/write bus RWBS1. The data amplifier 74 includes a read amplifier (not shown) for amplifying read data transferred from the sense amplifier 72 connected to the selected bit line BE to the main input/output line (MIO) through the local input/output line to drive the read/write bus RWBS1 and a write amplifier (not shown) for receiving and amplifying write data transferred to the read/write bus RWBSI to drive the main input/output line (MIO).

A data input/output unit 85 includes (n+1) output buffers (not shown) for respectively driving data input/output terminals DQ0 to DQn with the read data (bit data) and a retiming register (not shown) for timing-adjusting the bit data output to the DQ terminals from the output buffers to enhance timing accuracy. The retiming register is clocked by an output clock signal LCK1 of a DLL 100A which will be described later. The data input/output unit 85 further includes in (n+1) receiver circuits (not shown) for respectively receiving bit data (write data) supplied to the data input/output terminals DQ0 to DQn. When the receiver circuits receive data, circuits of the output buffers are set to be output-disabled (with outputs thereof brought into a high-impedance state).

Parallel bit data (such as 4-bit parallel data) that have been read lo a plurality of the MIO lines (such as four MIO lines) in parallel from the memory cell array 70, amplified by a plurality of the data amplifiers 74 (such as four data amplifiers 74), and then outputted in parallel to the read/write bus RWBSI are temporarily supplied to a FIFO control unit 84, and are then outputted to the DQ terminal after a predetermined latency through the data input/output unit 85. In a synchronous DRAM (SDRAM), the predetermined latency corresponds to a CAS latency, which is the number of clock cycles from input of a READ command to output of first-bit data from the DQ terminal.

A command decoder 31 receives a command signal and predetermined bits of the address signal, and supplies a result of decoding to a control logic circuit 32. Though not limited thereto, as a command signal, a combination of signal values of a /CS (chip select) signal, a RAS (row address strobe) signal, a /CAS (column address strobe) signal, and a /WE (write enable) signal and a predetermined address signal bit field(s) are received as a command and its parameters.

The control logic circuit 32 receives a result of decoding by the command decoder 31 and generates, in accordance with an input command, various control signals related to read control, write control, refreshing, and the like to control the column system control circuit 51, the sense amplifiers (SAs) 72, the data amplifiers 74, and the like.

Parameters that are used to specify an operation mode of the synchronous semiconductor memory (such as a burst length) are set in a mode register 61 by a mode register set command received as one of the command signals.

A clock generation circuit 21 differentially receives complementary clock signals CK and /CK supplied from the outside and receives a clock enable signal CKE and generates an internal clock signal (internal reference clock signal) ICLK to supply the internal clock signal ICLK in a single-ended form to an internal circuits of the device. Operations of the internal circuits including a sequential circuit such as a flip-flop are performed in synchronization with the internal clock signal ICLK. When the clock enable signal CKE is Low, an operation at a subsequent rising edge of the clock CK (falling edge of the clock /CK) is ignored, so that the operations in the internal circuits driven by the internal clock signal ICLK are not performed. When the clock enable signal CKE is High, the clock generation circuit 21 outputs the internal clock signal ICLK synchronized with the clock signals CK and /CK.

The DLL (Delay Lock Loop: delay lock loop) 100A outputs a clock signal LCLK1 delayed from the external complementary clock signals CK and /CK by a predetermined delay time.

The DLL 100A includes an initial-stage circuit 101, a delay circuit 102, a DQ replica 105A, a phase detector circuit 104, and a delay control counter 103A. The initial-stage circuit 101 includes a receiver circuit (not shown) that differentially receives the external clock signals CK and /CK to provide a single-ended output. The delay circuit 102 receives the clock signal outputted from the initial-stage circuit 101, delays and outputs the clock signal. A delay time of the delay circuit 102 can be variably set. The DQ replica 105A includes a buffer (also referred to as a "dummy buffer") equivalent to each output buffer not shown in the data input/output unit 85. The DQ replica 105A receives the clock signal LCK1 outputted from the delay circuit 102, and delays the clock signal LCK1 by a delay amount corresponding to a propagation delay time of the output buffer to output the delayed the clock signal LCK1. The phase detector circuit 104 detects a phase difference between the output signal of the DQ replica 105A and the external clock signals CK and /CK. The delay control counter 103A receives a result of the phase detection (up/down signal corresponding to a phase advance/delay) by the phase detector circuit 104 to increment or decrement a count value, thereby functioning as an integrator. The delay lime of the delay circuit 102 is determined, based on the count value of the delay control counter 103A. When the delay circuit 102 is composed by a VCDL (Voltage Controlled Delay Line) whose delay is varied by a control voltage, the count value (digital value) of the delay control counter 103A is converted to an analog voltage by a DA converter not shown, and is applied to the VCDL of the delay circuit 102.

When a rising phase of the signal obtained by delaying the clock signal LCK1 by a time corresponding to the delay time of the DQ replica 105A is aligned with a rising phase of the external clock signal CK, the DLL 100A is in a locked state. In this case, the phase detector circuit 104 outputs a phase comparison result that indicates a phase advance or a phase delay. The delay control counter 103A counts one count up or down in accordance with the phase comparison result. A delay obtained by averaging count values of the delay control counter 103A is then set in the delay circuit 102. When the external clock signals CK and /CK and the output of the DQ replica 105A are phase-aligned during when the DLL 100A is in a locked state, a rise timing of the output clock signal LCLK1 of the DLL 100A advances from a rise timing of the external clock signal CK, by a time corresponding to the delay time of the DQ replica 105.

An adjustment delay circuit 91 outputs to an output latency control circuit 80A a signal LCLK2 obtained by adjusting a delay of the output LCLK1 of the DLL 100A, corresponding to the delay of the DQ replica 105A.

A signal RCMD is an internal read command signal, which is a control signal outputted from the control logic circuit 32 in synchronization with the internal clock signal ICLK. When an input command has been decoded by the command decoder 31 and then has been found to be a read command, the internal read command signal RCMD is outputted from the control logic circuit 32 that has received a result of decoding by the command decoder 31.

The output latency control circuit 80A includes an output control circuit 81A that receives the internal read command signal RCMD and the signal LCLK2 obtained by adjusting the delay of the output signal LCLK1 of the DLL by the adjustment delay circuit 91 and a latency control unit 82 that receives a control signal OE0 outputted from the output control circuit 81A to perform latency control.

The output control circuit 81A includes a logical operation circuit that performs a logical operation on the signal LCLK2 and the internal read command signal RCMD. Though not limited thereto, the output control circuit 81A includes an AND circuit that performs the following AND operation on the signal LCLK2 and the internal read command signal RCMD:

OE0=AND (LCLK2, RCMD)

Responsive to the activation (High) of the signal OE0 from the output control circuit 81A, the latency control circuit 82 activates an output enable rise signal (OER) for clock cycles corresponding to a burst length BL (corresponding to four clock cycles when BL=8, for example) from a rising edge of the internal clock signal ICLK and activates an output enable fall signal (OEF) for the clock cycles corresponding to the burst length BL (corresponding to four clock cycles when BL=8, for example) from a falling edge of the internal clock signal ICLK.

The FIFO control unit 84, which is a buffer circuit in a read system, includes a memory FIFO (First In and First Out) of a first-in-first-out type, a control unit (not shown) that controls reading from and writing to the memory FIFO, and a parallel-to-serial conversion circuit (not shown) that converts parallel bits outputted from the memory FIFO to serial bits. The FIFO control unit 84 writes parallel bit data (e.g. 4-bit parallel data) read to the read/write bus RWBSI to the memory FIFO (not shown) in parallel in response to a generated write clock signal (signal FIFO_INPUT synchronized with the internal clock signal ICLK, which will be described later, for example), reads parallel data written in the FIFO memory in parallel in response to a generated read clock(signal FIFO_OUTPUT synchronized with the internal clock signal ICLK, for example, which will be described later), converts the parallel bit data to a serial bit signal by the parallel-to-serial conversion circuit (not shown), and serially transfers the serial bit signal to the data input/output unit 85 at a double data rate (the internal clock signal ICLK, for example, is used as a clock for the transfer).

The data input/output unit 85 captures the bit data serially transferred from the FIFO control unit 84 into a register (not shown), using the output clock signal LCLK1 of the DLL 100A to perform timing adjustment, and supplies the bit data to the output buffer (not shown). The output buffers (not shown) drive DQ terminals (wirings). 8-bit burst data D0 to D7 which are outputted from the FIFO control unit 84 to DATA0 which is an LSB (Least Significant Bit) output of the FIFO control unit 84, are supplied to the output buffer (not shown) whose output is connected to the data terminal DQ0 at the double data rate, in response to a rise and a fall of the clock signal LCLK1. and are sequentially output to the DQ0 terminal from the output buffer.

A rising edge of the clock signal LCLK1 outputted from the DLL 100A advances in time from a rising edge of the external clock signal CK by the propagation delay time (propagation delay time of the output buffer). The output timing of even-numbered data (D0, D2, D4, D6) supplied to the output buffer (not shown) to the DQ0 terminal in synchronization with the rising edge of the clock signal LCLK1 coincides with the rise timing of the external clock signal CK. Further, in case a duty ratio of the clock signal is 50%, the output timing of odd-numbered data (D1, D3, D5, D7) supplied to the output buffer (not shown) to the DQ0 terminal in synchronization with the falling edge of the clock signal LCLK1 coincides with the fall timing of the external clock signal CK. For simplicity of explanation, FIG. 12 shows an example in which the synchronous semiconductor memory includes one DLL 100A and phase comparison is made between rising edges of the external clock signal CK and the output of the DQ replica. A configuration may be used where the synchronous semiconductor memory includes two DLLs, signals respectively obtained by delay locking the rising and falling edges of the external clock signal CK are generated, and these signals are synthesized, for output.

Clock change-over from the internal clock signal ICLK to the clock signal LCLK2 is substantially performed at the output control circuit 81A.

The internal read command RCMD is outputted from the control logic circuit 32 to the output control circuit 81A in synchronization with the internal clock signal ICLK. The output control circuit 81A, responsive to the internal read command RCMD, generates the output control signal OE0 in synchronization with the clock signal LCLK2.

[Patent Document 1]
JP Patent Kokai Publication No. JP2002-230973A, which corresponds to U.S. Pat. No. 6,643,215B2

Following describes an analysis of the prototype example in FIG. 12 by the inventor of this application.

A clock timing skew may occur between respective clock timings of the signal LCLK2 obtained by delaying the output signal LCLK1 of the DLL 100A by the adjustment delay circuit 91 and the internal clock signal ICLK. The reason for the occurrence of this skew is that process dependencies are different between the internal clock signal ICLK from the clock generation circuit 21 and the clock signal LCLK2 in terms of a power supply voltage characteristic, a temperature characteristic, and so forth. The clock signal LCLK2 is obtained by delaying the output LCLK1 of the DLL 100 including in a loop thereof the DQ replica 105A that is driven by a power supply voltage corresponding to the signal amplitude of each DQ terminal.

Basically, output control by the output control circuit 81A or output control of the signal OE0 is performed by one clock cycle tCK. That is, the internal read command, signal RCMD is outputted from the control logic circuit 32 in synchronization with the internal clock signal ICLK, and a period during which the internal command signal RCMD is asserted is set to be less than one clock cycle tCK. In an SDRAM DDR 3, the one clock cycle tCK becomes approximately lns (nanosecond). Accordingly, a timing margin becomes crucial, so that a timing failure tends to occur.

When the power supply voltage decreases, the delay time of the DQ replica 105A increases. Consequently, a time difference between an effective edge (rising edge) of the output signal LCLK1 of the DLL 100A and an effective edge (falling edge) of the external clock signal CK increases. That is, a rise timing of the signal LCLK1 is temporally further in advance of a rise timing of the external clock signal CK. On the other hand, when the power supply voltage decreases, a delay of the internal clock signal ICLK outputted from the clock generation circuit 21 increases. Then, due to the delay of the internal clock signal ICLK, a timing at which the internal read command signal RCMD is asserted is delayed.

As a result, a timing at which the signal LCLK2 obtained by delaying the output signal LCLK1 of the DLL 100A by the adjustment delay circuit 91 rises from Low to High, becomes earlier in the output control circuit 81A (AND circuit). A timing at which the internal read command signal RCMD rises from Low to High is delayed. A period during which a High period of the signal LCLK2 and a High period of the internal read command signal RCMD overlap in time with each other may be narrowed (or may be extremely narrowed). Alternatively, the High period of the signal LCLK2 and the High period of the internal read command signal RCMD may not overlap at all. Consequently, the signal OE0 may not be properly outputted from the output control circuit 81A, thereby causing a malfunction. A pulse width of the signal OE0 may be narrowed into a glitch, causing a setup/hold time error in a subsequent-stage circuit. Alternatively, a pulse of the signal OE0 may not be output, thereby causing a malfunction in a subsequent-stage circuit.

When the one clock cycle tCK is further shortened, a leading edge of a High pulse of the signal LCLK2 in the next cycle may overlap in time with a trailing edge of a High pulse of the internal read command signal RCMD. In this case, the signal OE0 may be erroneously outputted from the output control circuit 81A at a timing at which the signal OEO should not be output according to the design specification.

As described above, a timing margin in the configuration shown in FIG. 12 is crucial. The output control signal OE0 may not be outputted from the output control circuit at a proper timing, so that a malfunction may occur.

SUMMARY

The present invention is schematically configured as follows so as to solve at least one of the above-mentioned problems (however, the present invention is not of course limited to the configurations that will be described below). A device according to the present invention comprises: a first clock generation circuit that receives an external clock signal supplied to the device, delays the external clock signal to output a first clock signal synchronized with the external clock signal; and a circuit that generates a control signal to control output of data, based on a plurality of second clock signals obtained by frequency-dividing an internal clock signal generated from the external clock signal, and a plurality of third clock signals obtained by frequency-dividing the first clock signal generated by the first clock generation circuit.

According to one aspect of the present invention, there is provided a device comprising:

a second clock generation circuit that receives the external clock signal to generate an internal clock signal;

a first frequency divider circuit that frequency-divides the internal clock signal to generate a plurality of second clock signals with phases thereof mutually spaced by a time corresponding to one cycle thereof;

a first clock generation circuit receives the external clock signal, delays the external clock signal by a variable delay element to output the first clock signal, and adjusts a delay time of the variable delay element so that a fourth clock signal obtained by delaying the first clock signal and the external clock signal are phase-aligned;

an adjustment circuit that receives the a plurality of the second clock signals and the fourth clock signal, determines a phase relationship between each of the second clock signals and the fourth clock signal, interchanges an order of the first clock signals according to a result of the determination, and outputs a plurality of first adjusted clock signals;

a second frequency divider circuit that frequency-divides the first clock signal to generate a plurality of third clock signals; and a control circuit that generates a first output control signal based on a logical operation on each of the first adjusted clock signals, one of the third clock signals corresponding to the first adjusted clock signal, and an internal command signal instructing data output, and then generates, from the first output control signal, a plurality of the control signals to control respectively output of a plurality of data.

According to another aspect of the present invention, there is provided a device comprising:

a second clock generation circuit that receives the external clock signal;

a first frequency divider circuit that frequency-divides a clock signal outputted from the second clock generation circuit to generate the second clock signals with phases thereof mutually spaced by a time corresponding to one cycle of the external clock signal;

a clock selector circuit that switches between the clock signal from the second clock generation circuit and one of the second clock signals;

a first clock generation circuit that receives the clock signal from the clock selector circuit, outputs the first clock signal obtained by delaying the clock signal by a variable delay element thereof, and adjusts a delay time of the variable delay element so that a fourth clock signal obtained by delaying the first clock signal and the clock signal from the clock selector circuit are phase-aligned;

a phase comparison circuit that compares phases of the fourth clock signal outputted from the first clock generation circuit and having a cycle that is a predetermined times a cycle of the external clock signal and the second clock signal of a first phase outputted from the first frequency divider circuit to determine whether a phase relationship between the second clock signals with respect to the fourth clock signal is an in-phase relationship or an opposite-phase relationship;

an adjustment circuit that interchanges the second clock signals, outputs the interchanged second clock signals as a plurality of first adjusted clock signals when a result of the phase comparison by the phase comparison circuit indicates the opposite-phase relationship, and outputs the second clock signals without alteration as the first adjusted clock signals when the result of the phase comparison indicates the in-phase relationship;

a second frequency divider circuit that frequency-divides the first clock signal outputted from the first clock generation circuit to generate the third clock signals having phases thereof mutually spaced by a time corresponding to one cycle of the first clock signal; and a control circuit that generates a first output control signal based on a logical operation on each of the first adjusted clock signals, one of the third clock signals from the second frequency divider circuit corresponding to the first adjusted clock signal, and an internal command signal instructing data output, and then generates from the first output control signal a plurality of control signals to control respectively output of a plurality of the data, wherein the clock selector circuit switches to supply one of the second clock signals to the first clock generation circuit according to a control signal outputted from the first clock generation circuit indicating that the first clock generation circuit is in a lock state, and the fourth clock signal corresponding to the one of the second clock signals is outputted from the first clock generation circuit, the fourth clock signal having the cycle that is the predetermined limes as long as the cycle of the external clock signal is supplied to the phase comparison circuit to be phase compared with the first-phase first clock signal, and the clock selector circuit supplies the clock signal from the second clock generation circuit to the first clock generation circuit at a predetermined timing after the phase comparison by the phase comparison circuit.

According to the present invention, an operating margin such as a timing margin of the semiconductor device is ensured. Stability of operation of the semiconductor device can be thereby achieved and a high-speed operation can be accommodated. According to the present invention, a malfunction due to output of the output control signal from the output control circuit at a timing at which the output control signal should not originally He output can he avoided. Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

EMBODIMENTS

In a semiconductor device according to one of embodiments, which is arranged to expand a timing margin in generating an output control signal (OE0), a circuit unit that generates the output control signal (OE0) based on an output signal of a DLL and an internal clock signal, generates frequency divided n phase clock signals of the output signal of a DLL, equally spaced by a time corresponding to one cycle of the output signal of the DLL and having a cycle that is n times the cycle of the output of the DLL (n being two, for example) and generates frequency divided n phase clock signals of the internal clock signal, equally spaced by a time corresponding to one cycle of the internal clock signal and having a cycle that is n times the cycle of the internal clock signal (n being two, for example). The circuit unit generates the output control signal (OE0), based on the frequency divided n phase clock signals of the output signal of the DLL and the frequency divided n phase clock signals of the internal clock signals, as a result of which operating margin such as the timing margin can be ensured. Stability of operation of the device can be thereby achieved and a high-speed operation of the device can be accommodated. In the circuit unit, there is provided a circuit that performs phase comparison to determine whether clock pulses of first to nth phases of the n-phase clock signals having the cycle that is the n times the cycle of the internal clock signal are in a normal order with respect to a timing, when the DLL is locked. In case the order of the clock pulses is not in the normal order, the circuit interchanges the n-phase clock signals. The circuit unit generates the output control signal (OE0), based on a logical operation on each of the n-phase clock signals having the cycle that is the n times the cycle of the internal clock signal and one of the n-phase clock signals of a corresponding phase having the cycle that is the n times the cycle of the output signal of the DLL and an internal command signal (RCMD) for instructing data output. The circuit unit generates a plurality of control signals (OER, OEF) for controlling output of a plurality of data.

Figure 1:
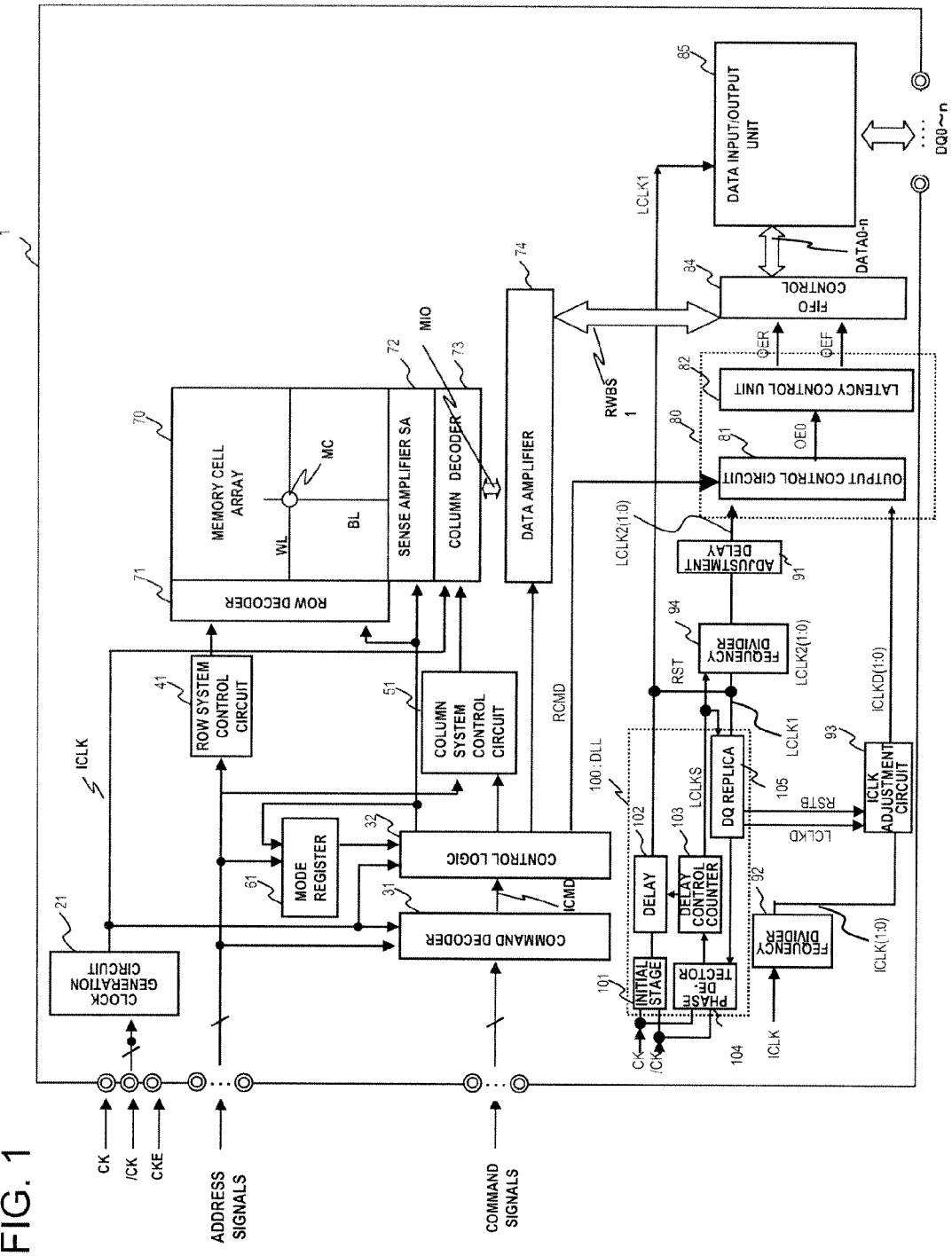
FIG. 1 is a diagram showing an overall configuration of a first exemplary embodiment of the present invention.

A semiconductor device according to one of the embodiments, as shown in FIG. 1 comprises:

a first clock generation circuit (21) that generates an internal clock signal (ICLK) from an external clock signal (CK, /CK);

a first frequency divider circuit (92) that frequency-divides by two the internal clock signal (ICLK) to generate two-phase second clock signals (ICLK (1:0)) of (a first phase and a second phase mutually spaced by 180° or a time corresponding to one cycle of the internal clock signal) and having the cycle twice as long as a cycle of the internal clock signal;

a first clock generation circuit (a delay locked loop circuit) (100) that receives the external clock signal (CK, /CK), outputs a first clock signal (delay locked clock signal) (LCLK1) obtained by delaying the external clock signal by a variable delay element (102) thereof, and adjusts a delay time of the variable delay element (102) to phase-align a fourth clock signal obtained (LCLKD) by delaying the first clock signal (delay locked clock signal) (LCLK1) by a DQ replica (105) and the external clock signal (CK, /CK);

an adjustment circuit (ICLK adjustment circuit 93) that determines a phase relationship between the two-phase second clock signals (ICLK (1:0)) and the fourth clock signal (LCLKD) when the delay locked loop circuit (100) is locked to judge whether or not clock pulses of the two-phase second clock signal of a first phase (ICLK(0)) and the two-phase second clock signal of a second phase (ICLK(1)) are in a normal order (in-phase relationship) with respect to the fourth clock signal (LCLKD), interchanges the order of the first-phase and second-phase second clock signals (ICLK(0), ICLK(1)) when the order of the first-phase and second-phase second clock signals (ICLK(0), ICLK(1)) are not in the normal order, that is in a reverse order (in an opposite-phase relationship), and respectively outputs the second clock signals of the second and first phases (ICLK(1), ICLK(0)) as second clock signals of first and second phases that have been adjusted (first adjusted clock signals) (ICLKD(0), ICLKD (1)), and respectively outputs the second clock signals of the first and second phases (ICLK(0), ICLK(1)) as the adjusted first clock signals (first adjusted clock signals) of the first and second phases (ICLKD(0), ICLKD(1)) when the first-phase and second-phase second clock signals (ICLK(0), ICLK(1)) are in the normal order;

a second frequency divider circuit (94) that frequency-divides by two the first clock signal (delay locked clock signal) (LCLK1) outputted from the delay locked loop circuit (100) to generate two-phase third clock signals (LCLK2 (1:0)) (of a first phase and a second phase mutually spaced by 180° or a time corresponding to one cycle of the first clock signal (delay locked clock signal)) and having a cycle twice as long as the cycle of the first clock signal (delay locked clock signal);

an adjustment delay circuit (91) that outputs, to an output latency control circuit 80, signals LCLK2 (1:0) obtained by adjusting a delay of the LCLK2 (1:0) outputted from the second frequency divider circuit (94), corresponding to the delay of the DQ replica (105):and a control circuit (80) that includes:

a first logic circuit (AND1 in FIG. 5) that performs a logical operation on the first adjusted clock signal of the first phase (ICLKD(0)) outputted from the adjustment circuit (93), the third clock signal of a first phase (LCLK2(0)) outputted from the second frequency divider circuit (94), and the internal command signal (RCMD);

a second logic circuit (AND2 in FIG. 5) that performs a logical operation on the first adjusted clock signal of the second phase (ICLKD(1)) outputted from the adjustment circuit (93), the third clock signal of a second phase (LCLK2(1)) outputted from the second frequency divider circuit (94), and the internal command signal (RCMD); and a third logic circuit (OR in FIG. 5) that synthesizes output signals of the first and second logic circuits to output the first output control signal (OE0). The control circuit (80) generates from the first output control signal (OE0) second and third output control signals (OER, OEF) to control respectively output of data corresponding to at least even-numbered and odd-numbered data of a plurality of data. The above configuration is one of the exemplary embodiments, and the present invention is not limited to such a configuration. The two-phase clocks having the cycle twice as long as the cycle of the internal clock signal may be of course set to be n-phase clocks having a cycle that is n times the cycle of the internal clock signal (n being four or the like, for example). The two-phase clocks having the cycle twice as long as the cycle of the delay locked signal may be of course set to be n-phase clocks having a cycle that is n times the cycle of the delay locked signal ( n being four or the like, for example).

Figure 8:
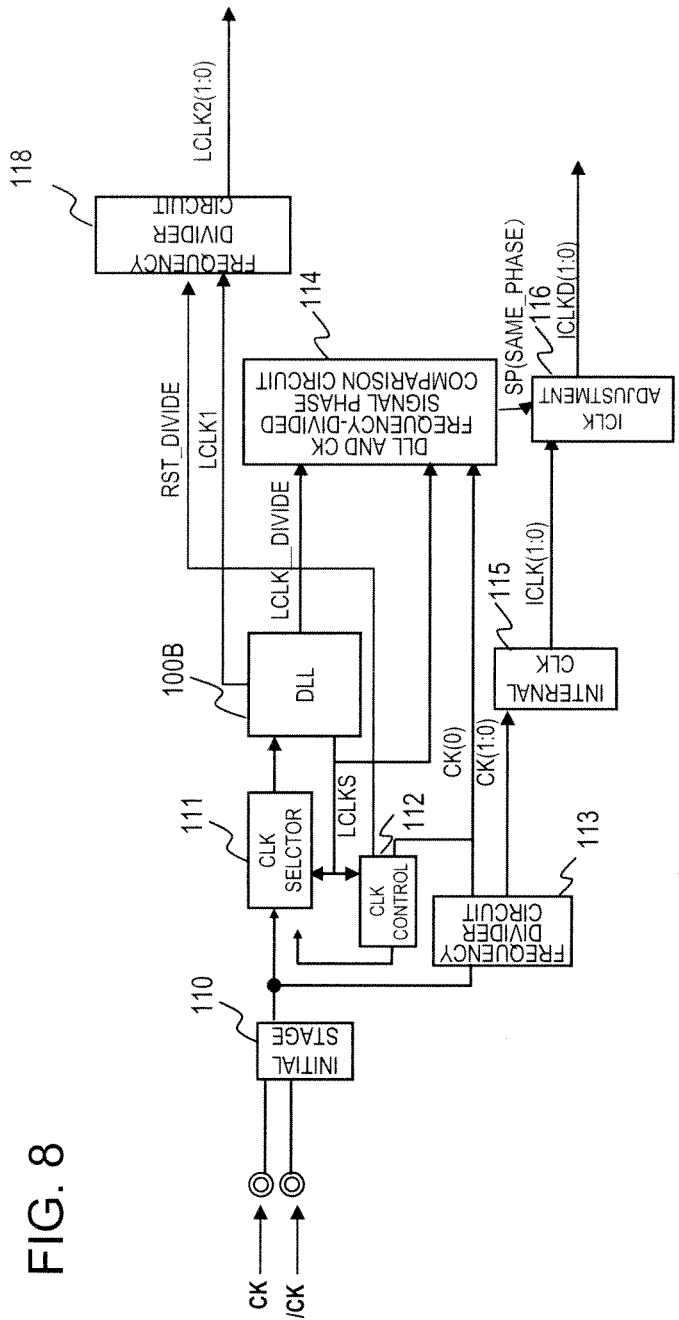
FIG. 8 is a diagram showing configurations of circuits in the vicinity of a DLL in the second exemplary embodiment of the present invention.

A semiconductor device according to another one of the embodiments, as shown in FIG. 8, comprises:

a second clock generation circuit (110) that receives the external clock signal (CK,/CK):

a first frequency divider circuit (113) that frequency-divides by two a clock signal outputted from the second clock generation circuit (110) to generate two-phase clock signals (CK (1:0)) of (a first phase and a second phase mutually spaced by 180° or a time corresponding to one cycle of the external clock signal) and having a cycle twice as long as the cycle of the external clock signal;

a clock selector circuit (111) that switches between the clock signal outputted from the second clock generation circuit (110) and the clock signal of the first phase (CK(0)) outputted from the first frequency divider circuit (113);

a first clock generation circuit (a delay lock loop circuit) (100B) that receives the clock signal outputted from the clock selector circuit (111), delays the clock signal by a variable delay element thereof to output a first clock signal (delay locked clock signal) (LCLK1), and adjusts a delay time of the variable delay element so that a fourth clock signal obtained by delaying the first clock signal (delay locked clock signal) by a DQ replica and the input clock signal are phase-aligned;

a phase comparison circuit (114) that coin pa res phases of the clock signal of the first phase (CK(0)) outputted from the first frequency divider circuit (113) and a third clock signal (LCLK_DIVIDE) that has a cycle twice as long as the cycle of the external clock signal and is outputted from the delay lock loop circuit (100B) when the first clock generation circuit (delay lock loop circuit) (100B) is locked to determine whether a phase relationship between the clock signals (CK (0), CK(1)) with respect to the third clock signal (LCLK_DIVIDE) is an in-phase relationship or an opposite-phase relationship;

a third clock generation circuit (115) that generates second clock signals (ICLK(0), ICLK(1)) respectively from the two phase clock signals (CK(0), CK(1)) outputted from the first frequency divider circuit (113);

an adjustment circuit (116) that respectively outputs the second clock signals of the first phase and a second phase (ICLK(0), ICLK(1)) as adjusted first clock signals (first adjusted clock signals) of first and second phases (ICLKD(0), ICLKD(1)) when a result of the phase comparison by the phase comparison circuit indicates the in-phase relationship, and interchanges the second clock signals of the first and second phases (ICLK(0), ICLK(1)) and respectively outputs the second clock signals of the second phase and the first phase ICLK(1), ICLK(0)) as the adjusted first clock signals (first adjusted clock signals)of the first and second phases (ICLKD(0), ICLKD(1)) when the result of the phase comparison by the phase comparison circuit indicates the opposite-phase relationship;

a second frequency divider circuit (118) that frequency-divides by two the first clock signal (delay locked clock signal) (LCLK1) outputted from the delay lock loop circuit (100B) to generate two-phase third clock signals (LCLK2 (1:0)) (of a first phase and a second phase mutually spaced by 180° or a time corresponding to one cycle of the first clock signal (delay locked clock signal)) and having a cycle twice as long as the cycle of the first clock signal (delay locked clock signal); and a control circuit (80) that includes:

a first logic circuit (AND1 in FIG. 5) that performs a logical operation on the first adjusted clock signal of the first phase (ICLKD(0)) outputted from the adjustment circuit (116), the third clock signal of a first phase (LCLK2(0)) outputted from the second frequency divider circuit (118), and the internal command signal (RCMD);

a second logic circuit (AND2 in FIG. 5) that performs a logical operation on the first adjusted clock signal of the second phase (ICLKD(1)) outputted from the adjustment circuit (116), the third clock signal of a second phase (LCLK2 (1)) outputted from the second frequency divider circuit (118), and the internal command signal (RCMD); and a third logic circuit (OR in FIG. 5) that synthesizes output signals of the first and second logic circuits to output a first output control signal (OE0).

The control circuit (80) generates from the first output control signal second and third output control signals (OER, OEF) to control respectively output of data corresponding to at least even-numbered and odd-numbered data of a plurality of data. The clock selector circuit (111) switches to supply of the first-phase second clock signal (CK(0)) to the first clock generation circuit (delay lock loop circuit) (100B) according to a control signal (LCLKS) outputted from the delay lock loop circuit (100B) indicating that the first clock generation circuit (delay lock loop circuit) is in a lock state. The divided-by-two third clock signal (LCLK_DIVIDE) corresponding to the first-phase second clock signal (CK(0) is output to the phase comparison circuit (114) from the first clock generation circuit (delay lock loop circuit) (100B) to be phase compared with the first-phase second clock signal (CK(0)). The clock selector circuit (111) supplies the clock signal from the second clock generation circuit (110) to the first clock generation circuit (delay lock loop circuit) (100B) at a predetermined timing after the phase comparison by the phase comparison circuit (114).

The semiconductor device further includes a clock control circuit (112 in FIG. 8) that receives the output of the first frequency divider circuit (113) and supplies the output to the clock selector circuit (111). The clock control circuit (112)

receives the control signal (LCLKS) that is outputted from the first clock generation circuit (delay lock loop circuit) (100B) when the first clock generation circuit (delay lock loop circuit) (100B) is locked, and supplies a reset signal (RST_DIVIDE) to the second frequency divider circuit (118) when the control signal (LCLKS) becomes inactive from active. The second frequency divider circuit (118) outputs the double-cycle third clock signals of the two phases (LCLK2(1;0)) after predetermined cycles. The above configuration is one of the exemplary embodiments, and the present invention is not limited to such a configuration. The two-phase clocks having the cycle twice as long as the cycle of the external clock signal may be of course set to be n-phase clocks having a cycle that is n times the cycle of the external clock signal (n being four or the like, for example). The two-phase clocks having the cycle twice as long as the cycle of the delay locked signal may be of course set to be n-phase clocks having a cycle that is n times the cycle of the delay locked signal (n being four, for example).

<Embodiment 1>

FIG. 1 is a diagram showing an overall configuration of a synchronous semiconductor memory in a first embodiment. Same reference numerals are allotted to components that are the same as or correspond to those in FIG. 12.

Referring to FIG. 1, in connection with a DLL 100, the synchronous semiconductor memory includes a frequency divider circuit (referred to as an "ICLK frequency divider circuit") 92 for frequency-dividing an internal clock signal ICLK, an ICLK adjustment circuit 93, and an LCLK frequency divider circuit 94. An output latency control circuit 80 includes an output control circuit 81 that receives an output of the ICLK adjustment circuit 93, an output of the adjustment delay circuit 91 that adjusts a delay of the output LCLK2 (1:0) of the LCLK frequency divider circuit (94), corresponding to the delay of the DQ replica 105, and an internal read command signal RCMD to produce an output control signal CEO for supply to the latency control unit 82. The other configurations are substantially the same as those in FIG. 12. For this reason, a difference from FIG. 12 will be described below, and description of the same components will be appropriately omitted so as to avoid repetitive description.

Referring to FIG. 1, the delay control counter 103 in the DLL 100 includes a counter that receives a result of comparison (up/down) between complementary external clock signals CK and /CK and an output signal of a DQ replica 105 from the phase detector circuit 104 to count up or down a count value. When the external clock signals CK and /CK are phase-aligned with the output signal of the DQ replica 105 (e.g. a rising edge of the external clock signal CK is phase-aligned with a rising edge of the output signal of the DQ replica 105) and the DLL 100 is locked, the delay control counter 103 activates a control signal LCLKS that indicates completion of the locking (locked state) (the delay control counter 103 sets the control signal LCLK to High, for example). The delay control counter 103 repeats counting up/down based on result of comparison by the phase detector circuit 104. When the DLL 100 is locked and count values are smoothed (averaged), the count value becomes a certain constant value. The delay control counter 103 detects this state, and activates the control signal LCLKS.

The DQ replica 105 receives the control signal LCLKS. The DQ replica 105 switches supply of its output. When the control signal LCLKS is in an inactive state (the DLL 100 is in an unlocked state), the DQ replica supplies its output to the phase detector circuit 104. When the signal LCLKS is in an active state (the DLL 100 is in a locked state), the DLL 100 switches supply of its output to the ICLK adjustment circuit 93 outside the DLL 100 as a signal LCLKD.

When the DLL 100 is in an unlocked state, the DLL 100 compares phases of the clock signal CK and the output signal of the DQ replica 105 by the phase detector circuit 104, and feedback control of the delay circuit 102 is performed so that the clock signal CK is phase-aligned with the output signal of the DQ replica 105.

It may be so arranged that when the DLL 100 is in the locked state, or when the signal LCLKS is active, the DQ replica 105 does not supply its output to the phase detector circuit 104. In this case, the count value of the delay control counter 103 is fixed to a count value at the time of completion of the locking. As a result, the delay time of the delay circuit 102 is fixed to a delay time at the time of completion of the locking.

When the signal LCLKS is active, the output LCLKD of the DQ replica 105 is supplied to the ICLK adjustment circuit 93 outside the DLL 100. When the signal LCLKS becomes active, the DQ replica 105 further supplies a restart signal (reset signal) RSTB (which is active at Low level and is inactive at High level) to the ICLK adjustment circuit 93. Though the circuit area increases, the synchronous semiconductor memory may be configured to include two DQ replicas and may be so configured that an output of a first DQ replica is supplied to the phase detector circuit 104 and an output of a second DQ replica is supplied to the ICLK adjustment circuit 93 at a time of completion of locking.

The ICLK frequency divider circuit 92 in this embodiment frequency-divides by two the internal clock signal ICLK generated by the clock generation circuit 21 and produces a clock signal ICLK (0) and a clock signal ICLK (1) of two phases having a cycle twice as long as a cycle of the internal clock signal ICLK. A rise timing of ICLK (1) is delayed from a rise timing of ICLK (0) by 180 degrees. The double-cycle and two phase clock signals ICLK(1:0) are supplied to the ICLK adjustment circuit 93. In the specification and the drawings of this application, the signals ICLK(1) and ICLK(0) of two bits are denoted as ICLK(1:0).

The ICLK adjustment circuit 93 receives the two phase clock signals ICLK (0) and ICLK (1) outputted from the ICLK frequency divider circuit 92, and receives the output signal LCLKD (that is delayed from the output LCLK1 of the DLL by a time corresponding to the delay time of the DQ replica 105). The ICLK adjustment circuit 93 further receives the restart signal RSTB from the DQ replica 105, and is initialized (reset) when the restart signal RSTB is Low.

When the signal ICLK (0) advances in time from the signal ICLK (1), with respect to the signal LCKD (i.e., when the signal ICLK (0) are in phase with the signal ICLK (1)), the ICLK adjustment circuit 93 arranges the signal ICLK (0) as an adjusted first-phase clock signal ICLKD (0), and arranged the signal ICLK (1) as an adjusted second-phase clock signal ICLKD (1). When the signal ICLK (1) advances from the signal ICLK (0) in time, with respect to the signal LCKD (i.e., when the signal ICLK (1) is in opposite phase with the signal ICLK (0)). the ICLK adjustment circuit 93 interchanges the signals ICLK(1) and ICLK(0), and arranges the signal ICLK (1) as the adjusted first-phase clock signal ICLKD (0) and arranges the signal ICLK (0) as the second-phase adjusted clock signal ICLKD (1).

The output signals ICLKD (0) and ICLKD (1) of the ICLK adjustment circuit 93 respectively rise at timings of rising edges of the signals ICLK (0) and ICLK (1) or at timings of the rising edges of the signals ICLK (1) and ICLK (0). High pulse periods of the output signals ICLKD (0) and ICLKD (1) are respectively extended from High pulse widths of the signals ICLK (0) and ICLK (1).

In case a rising edge of the signal LCLKD is delayed from a rising edge of the signal ICLK (0) and advances in time from a rising edge of the signal ICLK (1), the signal ICLK (0) is set as the signal ICLKD (1), and the signal ICLK (1) is set as the signal ICLKD (0) (which means that clock interchange is made). For this reason, a rising edge of the signal LCLKD appears in advance of a rising edge of the first-phase clock signal ICLKD (0), after the clock interchange has been made. A rising edge of the second-phase clock signal ICLKD (1) is delayed from the rising edge of the first-phase clock signal ICLKD (0) by one clock cycle (tCK).

In case the rising edge of the signal LCLKD is in advance of a rising edge of the signal ICLK (0), the signal ICLK (0) is determined to be in phase with the signal ICLK(1). Then, the signals ICLK (0) and ICLK (1) are respectively arranged as the signals ICLKD (0) and ICLKD (1). The rising edge of the signal LCLKD appears in advance of the rising edge of the first-phase clock signal ICLKD (0). The rising edge of the second-phase clock signal ICLKD (1) is delayed from the rising edge of the first-phase clock signal ICLKD (0) by one clock cycle (tCK).

Figure 2:
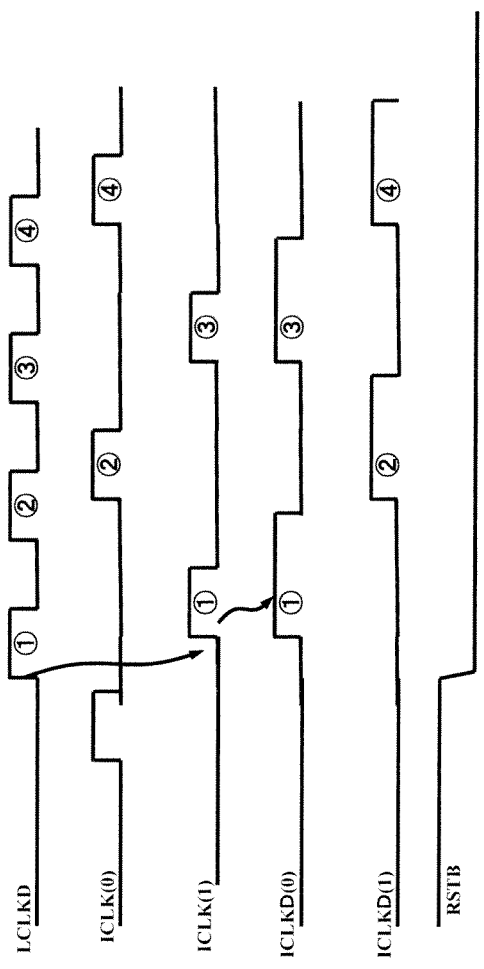
FIG. 2 is a timing diagram illustrating operation of an ICLK adjustment circuit in the first exemplary embodiment of the present invention.
Figure 3A:
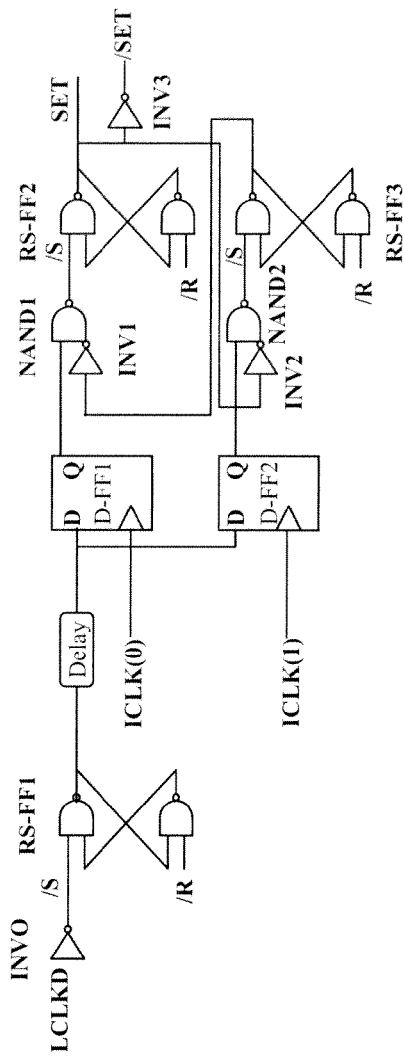
FIGS. 3A and 3B are diagrams showing a configuration example of the ICLK adjustment circuit in the first exemplary embodiment.
Figure 3B:
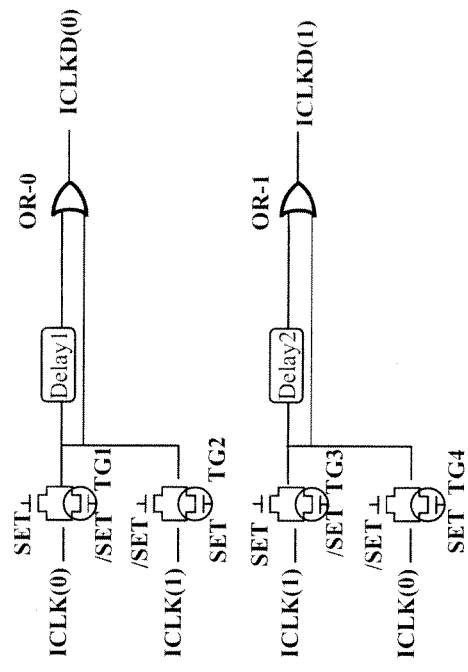

FIG. 2 is a diagram showing a liming operation of the signals supplied to the ICLK adjustment circuit 93 in FIG. 1 More specifically. FIG. 2 shows an example of timing waveforms of the signal LCLKD, the double-cycle two-phase clocks ICLK (1:0) obtained by frequency-dividing by two the internal clock signal ICLK. the restart signal (reset signal) RTSB, and the signals ICLKD(1:0) outputted from the ICLK adjustment circuit 93. FIGS. 3A and 3B are diagrams showing a configuration of the ICLK adjustment circuit 93 (which includes a phase comparison circuit and a switching circuit).

In the example shown in FIG. 2, first and third pulses of the signal LCLKD respectively correspond to first and third pulses of the second-phase clock signal ICLK (1) having the cycle twice as long as the cycle of the internal clock signal ICLK. Second and fourth pulses of the signal LCLKD correspond to second and fourth pulses of the first-phase clock signal ICLK (0) having the cycle twice as long as the cycle of the internal clock signal ICLK. Referring to the output timing of the first pulse of the signal LCLKD. the first-phase clock signal ICLK (0) having the cycle twice as long as the cycle of the internal clock signal ICLK is delayed from the second-phase clock signal ICLK (1). Then, the ICLK adjustment circuit 93 interchanges the signal ICLK (0) and the signal ICLK (1). The ICLK adjustment circuit 93 outputs a signal obtained by extending the pulse width of the second-phase signal ICLK (1) as the first-phase clock signal ICLKD (0), and outputs a signal obtained by extending the pulse width of the first-phase signal ICLK (0) as the second-phase clock signal ICLKD (1). With this arrangement, odd-numbered pulses of the signal LCLKD correspond to pulses of the signal ICLKD (0), and even-numbered pulses of the signal LCLKD correspond to pulses of the signal ICLKD (1).

Referring to FIG. 1. the restart signal RSTB is output to the ICLK adjustment circuit 93 from the DQ replica 105 that receives the lock signal LCLKS, and is activated (to be Low) when the DLL is in a lock state.

The phase comparison circuit in FIG. 3A compares phases among the signal LCLKD and the clock signals ICLK(0) and ICLK (1), and generates a signal SET that controls turning on/off of transfer gates of the circuit in FIG. 3B according to whether the signals ICLK (0) and ICLK (1) are in phase or in opposite phase to each other. FIG. 3B shows the circuit that switches between a straight connection and a cross connection among the input ICLK (0), the input ICLK (1), the output ICLKD (0) and the output ICLKD (1). and extends the High pulse periods of signals to be output as the signals ICLKD (1:0) from the pulse widths of the signals ICLK (1:0).

Referring to FIG. 3A, the reset signal RSTB is supplied to a reset terminal /R of each of RS flip-flops RS-FF1 to RS-FF3. In each of the RS flip-flops RS-FF1 to RS-FF3, outputs and inputs of two N AN D circuits are cross-connected. When the reset terminal /R is Low, an output of each of the RS flip-flops RS-FF1 to RS-FF3 is reset to 0 (Low). When a set terminal /S of each of the RS flip-flops RS-FF1 to RS-FF3 is set to Low, the output of each of the RS flip-flops RS-FF1 to RS-FF3 is set to 1 (High). When both of the set terminal /S and the reset terminal /R of each RS flip-flop are High, an output value of the RS flip-flop RS-FF is held. When both of the set terminal /S and the reset terminal /R of each RS flip-flop are Low, the output of the RS flip-flop becomes indefinite.

A signal obtained by inverting the signal LCLKD by an inverter INV0 is supplied to the set terminal /S of the RS flip-flop RS-FF1, and the restart signal (reset signal) RSTB is supplied to the reset terminal /R of the RS flip-flop RS-FF1.

Assume that the signal at Low level (thus meaning that the signal LCLKD is at High level) is supplied to the set terminal /S of the RS flip-flop RS-FF1 after the RS flip-flop RS-FF1 has been reset by the signal RSTB at Low level. Then, the output of the RS flip-flop RS-FF1 is set to 1 (High). The output of the RS flip-flop RS-FF1 is delayed by a delay circuit (Delay), and is then supplied to both data terminals of D-type flip-flops D-FF1 and D-FF2 in common.

The clocks ICLK (0) and ICLK (1) of the two phases obtained by frequency-dividing by two the internal clock signal ICLK. are supplied to clock terminals of the D-type flip-flops D-FF1 and D-FF2. The D-type flip-flops D-FF1 and D-FF2 respectively samples the signal LCLKD supplied to the data terminals of the D-type flip-flops D-FF1 and D-FF2 at rising edges of (he signals ICLK(0) and ICLK(1), and respectively outputs results of the sampling to output terminals Q of the D-type flip-flops D-FF1 and D-FF2.

Each of the D-type flip-flops D-FF1 and D-FF2 functions as a phase comparator. When a rise timing of the signal LCLKD is in advance of a rising timing of the signal ICLK (0) and the data terminal of the D-type flip-flop D-FF1 is High at the time of the rise of the signal ICLK (0), the D-type flip-flop D-FF1 outputs an output Q of 1 (at High level). On the contrary, when the phase of the signal LCLKD is delayed, and the data terminal of the D-type flip-flop D-FF1 is Low at the time of the rise of the signal ICLK (0), the D-type flip-flop D-FF1 outputs the output Q of 0 (at Low level).

When the phase of the signal LCLKD advances in time from the signal ICLK (1), and the data terminal of the D-type flip-flop D-FF2 at a time of a rise of the signal ICLK (1) is High, the D-type flip-flop D-FF2 outputs an output Q of 1 (at High level). On the contrary, when the phase of the signal LCLKD is delayed, and the data terminal of the D-type flip-flop D-FF2 is Low at the time of the rise of the signal ICLK (1), the D-type flip-flop D-FF2 outputs the output Q of 0 (at Low level).

The output Q of the D-type flip-flop D-FF1 is supplied to a first input terminal of a NAND circuit NAND1, and an output of the NAND circuit NAND1 is supplied to the set terminal /S of the RS flip-flop RS-FF2.

The output Q of the D-type flip-flop D-FF2 is supplied to a first input terminal of a NAND circuit NAND2, and an output of the NAND circuit NAND2 is supplied to the set terminal /S of the flip-flop RS-FF3.

The output of the RS flip-flop RS-FF2 is inverted by an inverter INV2 and is supplied to a second input terminal of the NAND circuit NAND2.

The output of the RS flip-flop RS-FF3 is inverted by an inverter INV1 and is supplied to a second input terminal of the NAND circuit NAND1.

The output of the RS flip-flop RS-FF2 and a signal obtained by inverting the output of the RS flip-flop RS-FF2 are respectively output as the signal SET and a signal /SET.

When the RS flip-flop RS-FF2 has been reset by the reset signal RSTB at Low level and an Low input is supplied to the set terminal /S of the RS flip-flop RS-FF2 (or the output of the NAND circuit DAND1 goes Low), an output SET of the RS flip-flop KS-FF2 is set to 1 (High), and the signal /SET is set to Low.

That is, when the output Q of the D-type flip-flop D-FF1 is High and the output Q of the D-type flip-flop D-FF2 is Low, for example, the output of the NAND circuit NAND2 is High. Thus, the output of the RS flip-flop RS-FF3 remains Low in a reset state. The signal obtained by inverting the output of the flip-flop RS-FF3 by the inverter INV1 is High, and both of the first and second input terminals of the NAND circuit NAND1 are High. As a result, the output of the NAND circuit NAND1 (to be input to the set terminal /S of the RS flip-flop RS-FF2) goes Low. When the set terminal /S of the RS flip-flop RS-FF2 goes Low. the output of the RS flip-flop RS-FF2 is set to be 1 (High), and the signal inverted by the inverter INV3 goes Low. That is, when a rise timing of the signal LCLKD advances from the signal ICLK (0) (the phase of the signal LCLKD advances from that of the signal ICLK (0)), the signal SET is set to High, and the signal /S is set to Low.

On the other hand, when the output Q of the flip-flop D-FF2 is High after the reset signal RSTB has been once set to Low, the output of the NAND circuit NAND2 goes Low, the output of the RS flip-flop RS-FF3 is set to 1 (High), the output of the inverter INV1 is set to Low, the output of the NAND circuit NAND1 is set to High, and the output of the RS flip-flop RS-FF2 remains Low in the reset state. Accordingly, the signal SET is set to Low, and the signal /S is set to High.

When the output Q of the D-type flip-flop D-FF2 is Low and the output Q of the D-type flip-flop D-EF1 is High, the RS flip-flop RS-FF2 is set, so that the signal SET is set to High, and the signal /S is set to Low, as described above. On the other hand, when the output Q of the D-type flip-flop D-FF1 is Low, the RS flip-flop RS-FF2 remains in the reset state, in which the signal SET is Low, and the signal /SET is High.

Referring to FIG. 3B, the switching circuit includes CMOS transfer gates TG1, TG2, TG3, and TG4. The signals SET and /SET are respectively supplied to gates of NMOS and PMOS transistors of the CMOS transfer gate TG1. The signals SET and /SET are respectively supplied to gates of PMOS and NMOS transistors of the CMOS transfer gate TG2. The signals SET and /SET are respectively supplied to gates of NMOS and PMOS transistors of the CMOS transfer gate TG3. The signals SET and /SET are respectively supplied to gates of PMOS and NMOS transistors of the CMOS transfer gate TG4. The signals ICLK (0) and the ICLK (1) are respectively supplied to the CMOS transfer gates TG1 and TG2. Outputs of the CMOS transfer gates TG1 and TG2 are connected in common to be branched into two signals. One of the branched signals is delayed by a delay circuit (Delay 1) and is then supplied to a first input terminal of a two-input OR circuit OR-0. and the other of the two branched signals is supplied to a second input terminal of the two-in put OR circuit OR-0 without alteration. The signals ICLK (1) and ICLK (0) are respectively supplied to the CMOS transfer gates TG3 and TG4, Outputs of the CMOS transfer gates TG3 and TG4 are connected in common to be branched into two signals. One of the branched signals is delayed by a delay circuit (Delay 2) and is then supplied to a first input terminal of a two-in put OR circuit OR-1, and the other of the two signals is supplied to a second input terminal of the two-input OR circuit OR-1 without alteration. The delay circuits Delay 1 and 2 have the same delay characteristics and the OR circuits OR-0 and OR-1 have the same delay characteristics.

When the signal SET is High and the signal /SET is Low, the CMOS transfer gates TG1 and TG3 turn on. The signal ICLK (0) is output as the signal ICLKD (0) with its pulse width extended by a time corresponding to a delay time of the delay circuit Delay 1, and the signal ICLK (1) is output as the signal ICLKD (1) with its pulse width extended by a time corresponding to a delay time of the delay circuit Delay 2.

When the signal SET is Low and the signal /SET is High, the CMOS transfer gates TG2 and TG4 turn on. The signal ICLK (1) is output as the signal ICLKD (0) with its pulse width extended by the time corresponding to the delay time of the delay circuit Delay 1, and the signal ICLK (0) is output as the signal ICLKD (1) with its pulse width elongated by the time corresponding to the delay time of the delay circuit Delay 2.

Figure 4:
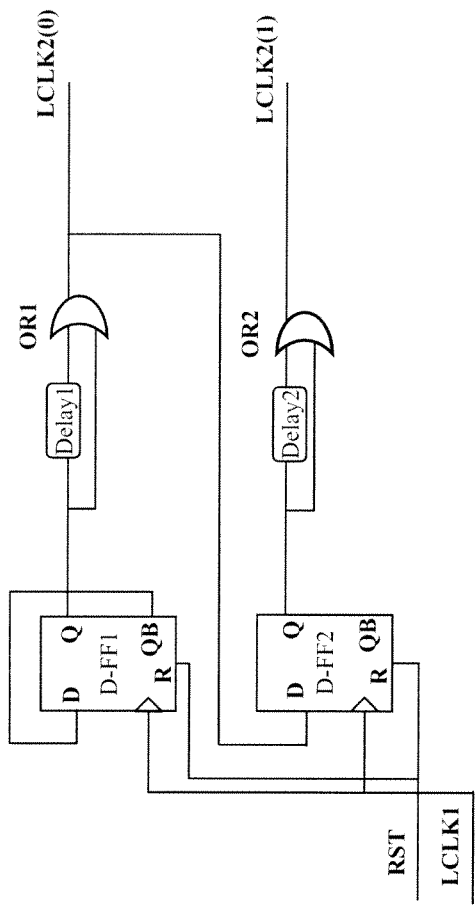
FIG. 4 is a diagram showing a configuration of an ICLK frequency divider circuit in the first exemplary embodiment.

FIG. 4 is a diagram showing a configuration example of the LCLK frequency divider circuit 94 in FIG. 1. Referring to FIG. 4. the LCLK frequency divider circuit 94 includes D-type flip-flops D-FF1 and D-FF2 that frequency-divide by two the signal LCLK1 to generate two-phase clock signals LCLK2 (1:0). The D-type flip-flops D-FF1 and D-FF2 both have reset terminals R. The reset signal RST (active High) which is activated when the DLL 100 detects that it is in a locked state is supplied from the DLL 100 to the reset terminal R of each of the D-type flip-flops D-FF1 and D-FF2. The signal LCLK1 is supplied to a clock terminal of each of the D-type flip-flops D-FF1 and D-FF2.

An inverting output terminal QB of the D-type flip-flop D-FF1 is fed back to a data terminal D of the D-type flip-flop D-FF1. Upon receipt of the RST signal at High level, each of the D-type flip-flops D-FF1 and D-FF2 is reset and an output terminal Q of each of the D-type flip-flops D-FF1 and D-FF2 is set to Low, and the output terminal QB of each of the D-type flip-flops D-FF1 and D-FF2 is set to High. Then, a High level of the terminal QB of the D-type flip-flops D-FF1 is applied to the data terminal of the D-type flip-flop D-FF1. The D-type flip-flop D-FF1 samples the High level at the data terminal D at a rising edge of a High pulse of the output signal LCLK1 of the DLL and outputs the High level to the output terminal Q and a Low level to the output terminal QB. A logical sum output of the D-type nip-Hop D-FF1 and a signal obtained by delaying the output Q by a delay circuit (Delay 1) by the OR circuit OR1 is output as the signal LCLK2 (0).

The signal LCLK2 (0) rises from Low to High in synchronization with a rising edge of the signal LCLK 1. The signal LCLK2 (0) does not fall from High to Low at the next rise timing of the signal LCLK1, but the next rise timing of the signal LCLK1 with a delay time of the delay circuit Delay 1 from the next rise timing of the signal LCLK1. The High pulse of the signal LCLK2 (0) has a pulse with corresponding to one clock cycle of the signal LCLK1 plus a delay time of the delay circuit Delay 1.

The signal LCLK2(1) rises from Low to High, being delayed from a rising edge of the signal LCLK2(0) by one cycle of the signal LCLK1, and set to have a High pulse of a pulse width corresponding to one clock cycle of the signal LCLK1 plus a delay time of the delay circuit Delay 2. The signals LCLK2(0) and LCLK2(1) are set to be two-phase clock signals obtained by frequency-dividing by two the signal LCLK1.

The output control circuit 81 in FIG. 1 receives the internal read command signal RCMD outputted from the control logic circuit 32, the signals LCLK2 (1:0) outputted from the LCLK frequency divider circuit 94, and the signals ICLKD (1:0) outputted from the ICLK adjustment circuit 93 to output the signal OE0.

Figure 5:
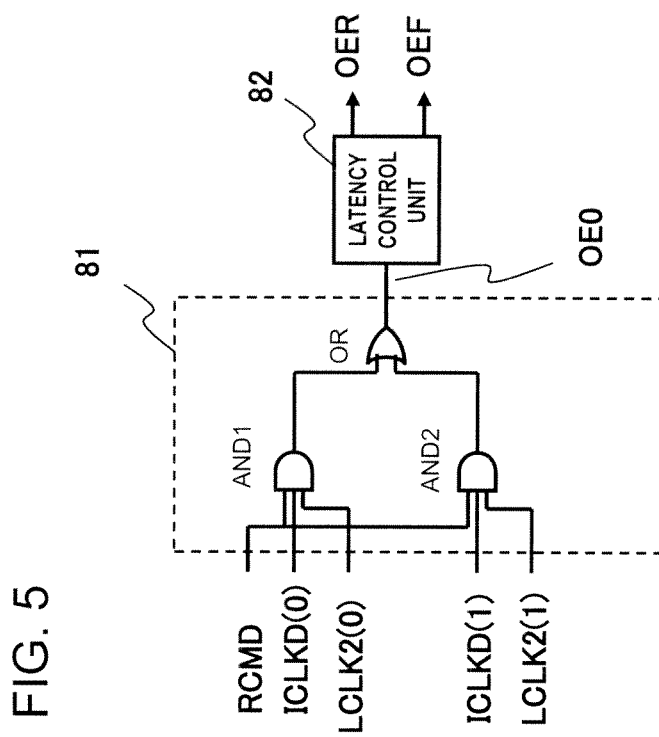
FIG. 5 is a diagram showing a configuration of an output control circuit in the first exemplary embodiment of the present invention.

FIG. 5 is a diagram showing a configuration of the output control circuit 81 in this embodiment. As shown in FIG. 5, the output control circuit 81 includes a three-input AND circuit AND1, a three-input AND circuit AND2, and a two-input OR circuit OR. The three-input AND circuit AND1 outputs a logical product of the signals RCMD, ICLKD (0) and LCLK2 (0). The three-input AND circuit AND2 outputs a logical product of the signals RCMD, ICLKD(1), and LCLK2(1). The two-input OR circuit OR outputs a logical sum of the outputs of the AND circuits AND1 and AND2, as the signal OE0.

Figure 12:
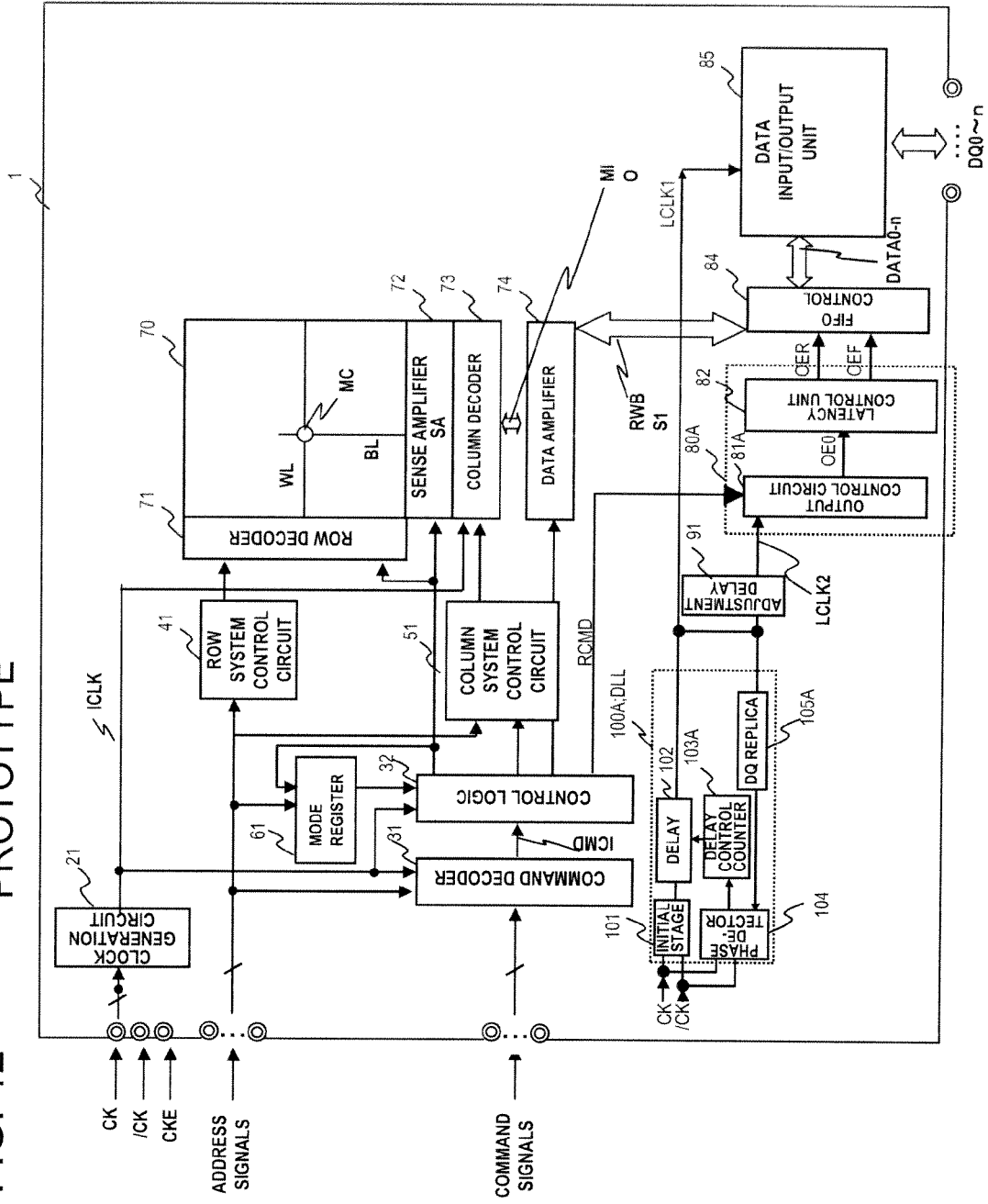
FIG. 12 is a diagram showing an overall configuration of a prototype example.

The latency control circuit 82 in FIG. 1 receives a High pulse of the signal OE0 from the output control circuit 81, and outputs one shot pulses OER and OEF each having a pulse width corresponding to the burst length BL, as described with reference to FIG. 12.

Figure 6:
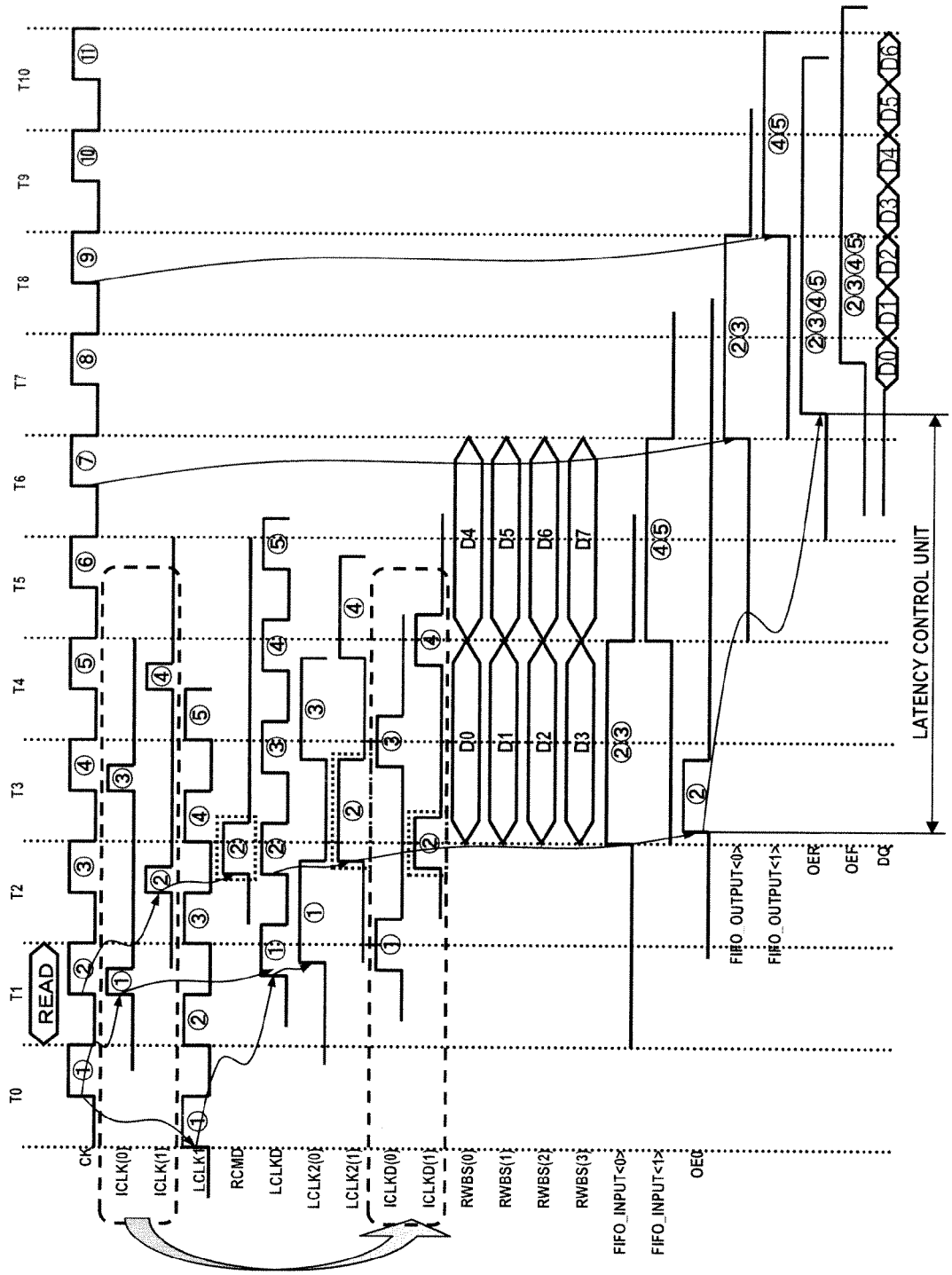
FIG. 6 is a timing diagram illustrating operation of the first exemplary embodiment (when signals ICLK (1:0) are in phase)

FIG. 6 is a diagram showing a timing operation example of the semiconductor memory in FIG. 1 when the number of clock cycles (CAS latency) needed from input of a read command (READ) (for specifying a column address) to output of first read data through the DQ terminal is 7.

FIG. 6 shows the non-inverting signal CK of the external clock signals CK and /CK, the outputs ICLK(0) and ICLK(1) of the ICLK frequency divider circuit 92, the output signal LCLK1 of the DLL 100, the internal read command signal RCMD, the signal LCLKD outputted from the DQ replica 105 to the ICLK adjustment circuit 93, the outputs LCLK2(0) and LCLK2(1) of the adjustment delay circuit 91, the outputs ICLKD(0) and ICLKD(1) of the ICLK adjustment circuit 93, read/write bus RWBS1 (RWBS(3:0)) of a four-bit width, FIFO write enable signals FIFO_INPUT<0> and FIFO_INPUT<1> of the FIFO control circuit 84, the output OE0 of the output control circuit 81, FIFO outputs of the FIFO control circuit 84 (output enable signals FIFO_OUTPUT<0>, FIFO_OUTPUT<1>), the output signals OER and OEF of the latency control unit 82, and serial bit data D0 to D7 from one-bit DQ terminal.

A horizontal right direction in FIG. 6 shows transition of time, and each of reference characters T0, T1, T2, . . . and the like indicates a clock cycle of the external clock signal CK. A number which is assigned to a High pulse of each signal and enclosed by a circle in the High pulse indicates that the High pulse corresponds to a High pulse number of the external clock signal CK.

A first pulse (to which the number "1" is assigned) of the clock signal CK in the cycle T0 corresponds to the signal ICLK (0) in the cycle T1. the signal LCLK1 in the cycle T0, the signal LCLKD in the cycle T1, and the signals LCLK2(0) and ICLKD(0) extending across the cycles T1 and T2.

A second pulse (to which the number "2" is assigned) of the clock signal CK in the cycle T1 corresponds to the signal ICLK (1) in the cycle T2, the signal LCLK1 in the cycle T1. the signal RCMD in the cycle T2, the signal LCLKD in the cycle T2, and the signals LCLK2(1) and LCLK2(1) extending across the cycles T2 and T3, wherein each of these corresponding signals has a pulse to which the number "2" is assigned.

The signal FIFO_INPUT<0> is associated with two cycles of T1 and T2, in which the READ command is supplied, and the signal FIFO_INPUT<1> is associated with two cycles of T3 and T4. The signal FIFO_OUTPUT<0> is associated with the two cycles T1 and T2, and the signal FIFO_OUTPUT<1> is associated with the two cycles T3 and T4. Each of the signals OER and ORF has a pulse width of cycles corresponding to the burst length and is associated with four cycles T1 to T4 (to which the numbers "2" to "5" are assigned).

In the DLL 100, delay control over the delay circuit 102 is performed so that rising edges of the clock signal CK and the output of the DQ replica 105 are aligned at the phase detector circuit 104. The rising edge of the signal LCLK1 is outputted earlier than the rising edge of the clock signal CK by a time substantially corresponding to the delay time of the DQ replica.

When the READ command is received in the cycle T1, the READ command is decoded by the command decoder 31. Then, a read command RCMD is generated from the control logic circuit 32 in synchronization with the internal clock signal ICLK (corresponding to the second pulse of the clock signal CK).

In this embodiment, cycles of the internal clock signal ICLK and the output signal LCLK of the DLL 100 are frequency-divided, thereby expanding a timing margin for taking each logical product (AND) operations by the output control circuit 81.

In the example in FIG. 6, the phase of the signal ICLK(0) advances in time from the phase of the signal ICLK (1) with respect to a first pulse (to which the number "1" is assigned) of the signal LCLKD. Accordingly, the ICLK adjustment circuit 93 respectively outputs the signals obtained by extending the High pulse widths of the signals ICLK(0) and ICLK (1) (refer to a thick arrow, on the left side of FIG. 6, which extends from the signals ICLK(0) and ICLK(1)) to the signals ICLKD(0) and ICLK(1)), as the signals ICLKD (0) and ICLKD (1). In the example shown in FIG. 6, the pulse (to which the number "1" is assigned) of the signal LCLKD is generated, corresponding to the pulse (to which the number "1" is assigned) of the signal CK in the cycle T0 immediately preceding the cycle T1 in which the READ command is received, and a pulse (to which the number "1" is assigned) of the signal ICLK (0) is outputted m the cycle T1. However, it is not fixed which one (to which the number "1" is assigned) out of the pulse of first-phase clock signal ICLK(0) and the pulse of first-phase clock signal ICLK(1) will be present in the cycle T1 when the READ command is received. There is a case (as shown in FIG. 6) in which the pulse (to which the number "1" is assigned) of the first-phase clock signal ICLK (0) is present in the cycle when the READ command is received and the pulse (to which the number "2" is assigned) of the second-phase clock signal ICLK(l) is outputted in the next cycle, while in another case (as described below with reference to FIG. 7), the pulse (to which the number "1" is assigned) of the second-phase clock signal ICLK(1) is present in the cycle when the READ command is received and the pulse (to which the number "2" is assigned) of the first-phase clock signal ICLK(0) is outputted in the next cycle. Thus, the ICLK adjustment circuit 93 performs phase comparison between the signals ICLK(0) and ICLK(1), and makes clock interchange when the clock interchange is necessary as shown in the following FIG. 7.

A High pulse having a pulse width of an overlapping duration of a High pulse (to which the number "2" is assigned) of the signal RCMD and High pulses (to each of which the number "2" is assigned) of the signals ICLKD(1) and LCLK2 (1), each corresponding to the pulse (to which the number "2"

is assigned) of the clock CK in the cycle T1, is outputted from the AND circuit AND2 and the OR circuit in FIG. 5. Then, the signal OEO with a High pulse width corresponding to the overlapping duration of the High pulses (to each of which the number "2" is assigned) is outputted from the output control circuit 81.

The High pulse (to which the number "2" is assigned) of the signal RCMD corresponding to the second pulse (to which the number "2" is assigned) of the clock signal CK in the cycle T1 does not overlap in time with High pulses (to each of which the number "2" is assigned) of the signals ICLKD(0) and LCLK2(0). For this reason, the output of the AND circuit AND1 in FIG. 5 is set to Low.

The latency control unit 82 generates the one shot pulses OER and OFF after an elapse of time from the timing of the rising edge of the High pulse of the signal OEO corresponding to a latency period. That is, the one shot pulses OER and OEF are delayed by a predetermined delay time (four clock cycles in FIG. 6) from the timing of the rising edge of the signal OEO in the cycle T3, corresponding to the CAS latency of 7, the one shot pulse OER is set to High in synchronization with the rising edge of the signal LCLK1 in the cycle T7. the one shot pulse OEF is set to High in synchronization with the falling edge of the signal LCLK1 in the cycle T7, and High levels of the one shot pulses OER and OEF are kept for a period of the four clock cycles corresponding to the burst length BL of 8. An output buffer in the data input/output unit 85 that receives even-numbered and odd-numbered bit data (D0 to D7) serially transferred from the FIFO control unit 84 to respective bits on a data bus Data 0—n in synchronization with rising and falling edges of the signal LCLK1 and are drives the bit data for output (D0 to D7) serially to the DQ terminal. The one shot pulse OER is associated with the even-numbered DQ outputs (D0, D2, D4, D6) to be output at the rise timing of the signal LCLK1, and the one shot pulse OFF is associated with the odd-numbered DQ outputs (D1, D3, D5, D7) to be output at the fall timing of the signal LCLK1.

Figure 7:
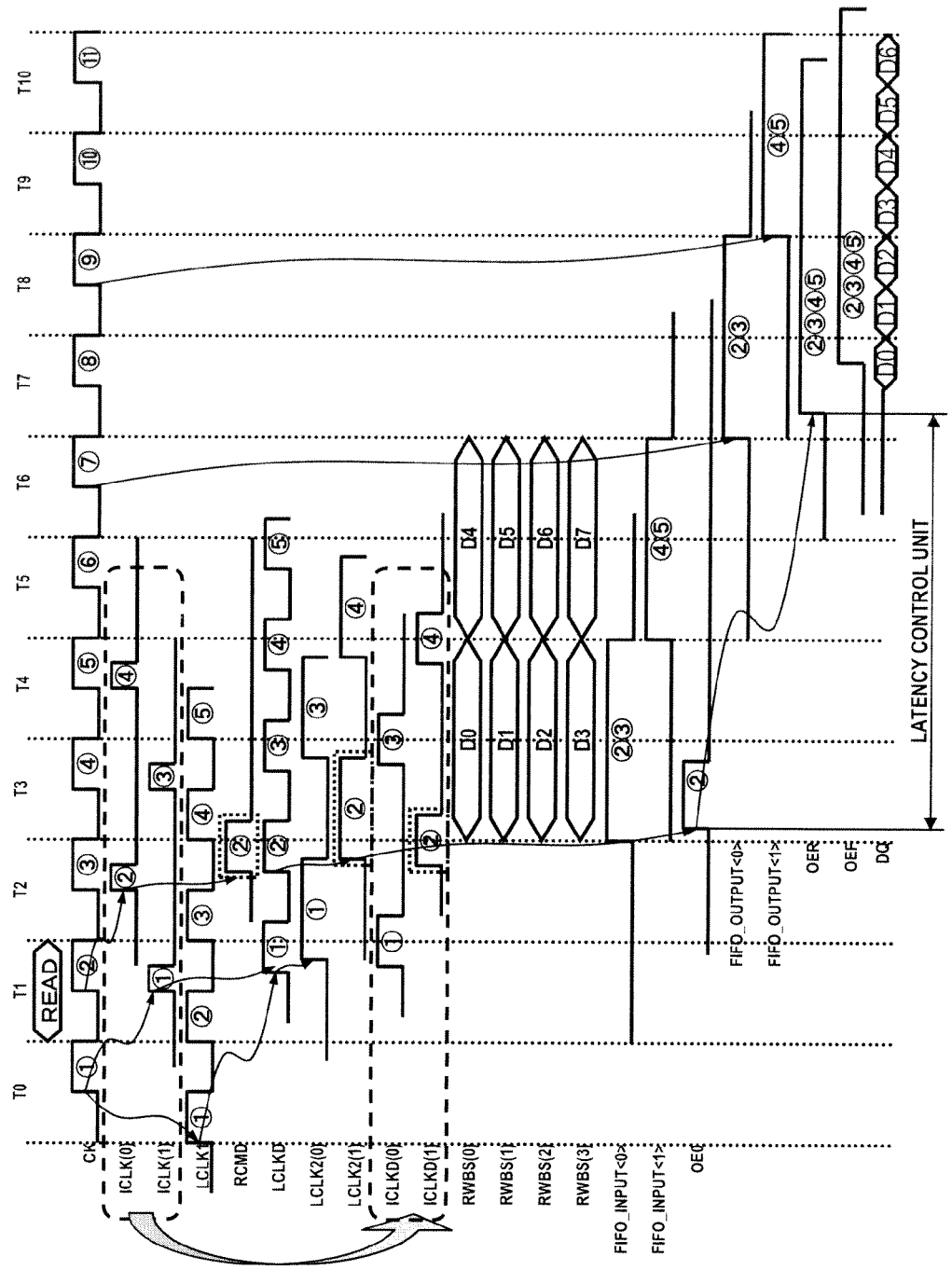
FIG. 7 is a timing diagram illustrating operation of the first exemplary embodiment (when the signals ICLK (1:0) are in opposite phase)

FIG. 7 is a diagram showing another timing operation example of FIG. 1, when the number of clock cycles (CAS latency) that is needed from input of a read command (for specifying a column address) to output of first read data through the DQ terminal is 7. Since signals whose waveforms are shown and a notation are the same as those in FIG. 6, explanation of the signals and the notation is omitted. The following describes a difference from the above described timing operation in FIG. 6. Out of the clocks of the two phases having the cycle twice as long as the cycle of the internal clock signal ICLK, the High pulse (to which the number "1" is assigned) of the ICLK (1) in the cycle T1 in which the read command RCMD is supplied corresponds to the first pulse (to which the number "1" is assigned) of the clock signal CK in the cycle T0, and the High pulse (to which the number "2" is assigned) of the signal ICLK(0) in the cycle T2 corresponds to the second pulse (to which the number "2" is assigned) of the clock signal CK in the cycle T1.

Referring to the cycle T1 in which the read command RCMD is supplied, the double-cycle first-phase clock signal ICLK (0) has a phase which is delayed from the second-phase clock signal ICLK (1) by 180 degrees (=one clock cycle tCK) (the first-phase clock signal ICLK (0) is in opposite phase with the second-phase clock signal ICLK (1)). With respect to the first pulse of the signal LCLKD, the phase of the signal ICLK (1) advances from the phase of the signal ICLK (0), The ICLK adjustment circuit 93 outputs, as the signals ICLKD (0) and ICLKD (1), respectively the signals obtained by extending the High pulse widths of the signals ICLK(1) and ICLK (0) (refer to a thick arrow extending from the signals ICLK(0) and ICLK(1) on the left side in FIG. 7 to the signals ICLKD (0) and ICLK(1)).

A High pulse having a pulse width of an overlapping duration of a High pulse (to which the number "2" is assigned) of the signal RCMD and High pulses (to which the number "2" is assigned) of the signals ICLKD(1) and LCLK2(1) corresponding to a pulse (to which the number "2" is assigned) of the clock signal CK in the cycle T1 is outputted from the AND circuit AND 2 and the OR circuit in FIG. 5. Then, the signal OEO with a High pulse width corresponding to the overlapping duration of the High pulses (to which the number "2" is assigned) is outputted from the output control circuit 81.

On the other hand, a High pulse (to which the number "2" is assigned) of the signal RCMD corresponding to a pulse (to which the number "2" is assigned) of the clock signal CK in the cycle T1 does not overlap in time with High pulses (to which the number "1" is assigned) of the signals ICLKD(0) and LCLK2(0). For this reason, the output of the AND circuit AND1 in FIG. 5 is set to Low.

<Second Exemplary Embodiment>

The following described a second exemplary embodiment. FIG. 8 is a diagram showing a configuration of the second exemplary embodiment of the present invention. A semiconductor memory device in the second exemplary embodiment includes:

an initial stage circuit 110 that differentially receives external clock signals CK and /CK to output a single-ended output to internal circuits provided in the semiconductor memory device;

a CK frequency divider circuit 113 that receives the clock signal outputted from the initial circuit 110, frequency-divides by two the clock signal, and generates clocks CK(0) and CK(1) of two phases having a cycle of 2tCK;

an internal CLK generation circuit 115 that receives the clocks CK(0) and CK(1) of the two phases outputted from the CK frequency divider circuit 113 to generate two-phase internal clock signals ICLK(0) and ICLK(1) having a cycle of 2tCK;

a CK control circuit 112 that receives the output CK(0) of the CK frequency divider circuit 113 and receives a signal LCLKS indicating completion of locking outputted from a DLL 100B;

a CK selector circuit 111 that receives the output of the initial circuit 110 and an output of the CK control circuit 112 and receives the signal LCLKS indicating completion of locking outputted from the DLL 100B as a switching control signal to supply the divide-by-two clock CK (0) from the CK control circuit 112 to the DLL 100B when the signal LCLKS is High (locking of the DLL 100B is completed);

the DLL 100B:

a DLL and CK frequency-divided signal phase comparison circuit 114 that compares phases of a clock signal LCLK_DIVIDE that has a cycle twice as long as the cycle of the external clock CK and is outputted from the DLL 100B and a first phase clock CK(0) that has a cycle twice as long as the cycle of the external clock CK and is outputted from the CK frequency divider circuit 113;

an ICLK adjustment circuit 116 that receives a phase comparison result SP from the DLL and CK frequency-divided signal phase comparison circuit 114 to respectively output signals obtained by extending pulse widths of the outputs ICLK (0) and ICLK (1) of the internal CLK circuit 115 as signals ICLKD (0) and ICLKD (1), when the clock LCLK_DIVIDE is in phase with the clock CK(0), and to respectively output signals obtained by extending the pulse widths of the outputs ICLK (1) and ICLK (0) as the signals ICLKD (0) and ICLKD (1), when the clock LCLK_DIVIDE is in opposite phase with the clock CK(0); and an LCLK frequency divider circuit 118 that receives a control signal RST_DIVIDE out putted from the CK control circuit 112 to output two-phase clocks LCLK2(0) and LCLK2(1) obtained by Frequency-dividing by two an output clock LCLK1 from the DLL 100B when the signal RST_DIVIDE is activated.

Though not limited thereto, the internal CLK generation circuit 115 outputs a one-shot pulse of a predetermined pulse width, responsive to a rising edge of each of the two-phase clocks CK(0) and CK(1) that are the outputs of the CK frequency divider circuit 113, and outputs signals having timing waveforms shaped, as the internal clock signals ICLK(0) and ICLK(1). With this arrangement, timing accuracy of the circuit in the subsequent stage is improved. The two-phase clocks CK (0) and CK(1) outputted from the CK frequency divider circuit 113 may be supplied to the ICLK adjustment circuit 116.

The two-phase clock signals LCLK2(0) and LCLK2(1) outputted from the LCLK frequency divider circuit 118 and having a cycle twice as long as a cycle of the signal LCLK1, the clock signals ICLKD(0) and ICLKD(1) of two phases outputted from the ICLK adjustment circuit 116 and having a cycle twice as long as a cycle of the internal clock signal are supplied to the output control circuit 81 in FIG. 1, together with the internal read command signal RCMD. The output control circuit 81 has the configuration shown in FIG. 5, so that the following operation is performed:

OE0=OR(AND(RCMD, ICLKD(0), LCLK2(0)), AND (RCMD, ICLKD(1), LCLK2(1)))

Each of the latency control unit 82, the FIFO control unit 84, and the data input/output unit 85 is set to have the same configuration as that in FIG. 1.

Like the DLL 100 in FIG. 1, the DLL 100B includes an initial stage circuit, the delay element, the DQ replica, the phase detector circuit and the delay control counter (all of which are not shown). The initial stage circuit of the DLL 100B includes a buffer circuit that does not receive differential outputs but receives a single-ended input. Alternatively, the initial stage circuit of the DLL 100B may be omitted. An output of the delay element (designated by reference numeral 102 in FIG. 1) in the DLL 100B is supplied to the DQ replica (designated by reference numeral 105 in FIG. 1) in the DLL 100B to be subjected to phase comparison with the input clock by the phase detector circuit (designated by reference numeral 104 in FIG. 1). As with the DLL 100 in FIG. 1, in the DLL 100B, a delay of the delay element (102) is controlled by the delay control counter (103 in FIG. 1) so that phases (timings) of an effective edge (rising edge) of the signal obtained by delaying an output signal LCLK1 of the DLL 100B and an effective edge (rising edge) of the received external clock signal (single-ended signal in FIG. 8) are aligned. The DLL 100B also outputs a signal obtained by dividing-by-two an output signal of the DQ replica (corresponding to the signal LCLKD in FIG. 1) to the DLL and CK frequency divider circuit phase comparison circuit 114 as the signal LCLK_DIVIDE. A rising edge of the divide-by-two clock LCLK_DIVIDE outputted from the DLL 100B is synchronized with a rising edge of the external clock signal CK at a time of a lock sequence of the DLL 100B or the like (refer to FIGS. 10 and 11 that will be later referred to).

The DLL 100B receives the output clock of the initial stage circuit 110 outputted from the CLK switching circuit 111. When completion of locking is detected by the delay control counter (designated by reference numeral 103 in FIG. 1) in the DLL 100B, the DLL 100B sets the control signal LCLK from Low to High, like the DLL 100 in FIG. 1. After completion of locking, the DLL 100B receives the first-phase clock CK(0) of the two-phase clocks CK (1:0) having the cycle twice as long as a cycle of the clock signal CK, which has been switched to be output by the CLK switching circuit 111, and outputs the divide-by-two clock LCLK_DIVIDE.

The CK control circuit 112, on receipt of High of the signal LCLKS from the DLL 100B, supplies the outputs of the CK frequency divider circuit 113 to the CLK switching circuit 111. When the signal LCLKS goes Low from High, the CK control circuit 112 activates the reset signal RST_DIVIDE (set to High level), and outputs the reset signal RST_DIVIDE to the LCLK frequency divider circuit 118.

The LCLK frequency divider circuit 118, on receipt of High of the reset signal RST_DIVIDE outputted from the CK control circuit 112, and is then reset. When the reset signal RST_DIVIDE goes Low, the LCK frequency divider circuit 118 outputs the two-phase clocks LCLK2 (0) and LCLK2 (1) having a cycle twice as long as the cycle of the clock LCLK1.

In this embodiment, after completion of locking of the DLL 100B using the external clock signal CK, the CK selector circuit 111 supplies to the DLL 100B the double-cycle first clock CK (0). The DLL and CK frequency-divided signal phase comparison circuit 114 makes phase comparison between the divide-by-two clock LCLK_DIVIDE from the DLL 100B and the double-cycle first-phase clock CK(0). After completion of the phase comparison, the CK selector circuit 111 switches the clock to be supplied to the DLL 100B back to the external clock signal CK. The double-cycle two-phase clocks LCLK2(0) and LCLK2(1) generated by frequency-dividing by two the output clock LCLK1 of the DLL 100B by the LCLK frequency divider circuit 118 are outputted. After completion of the phase comparison, the ICLK adjustment circuit 116 respectively sets the signals ICLK(0) and ICLK(1) as the signals ICLKD(0) and ICLKD(1), when the signals ICLK(0) and ICLK(1) are in phase with each other. When the signals ICLK(0) and ICLK(1) are in opposite phase with each other, the ICLK adjustment circuit 116 interchanges the clocks and respectively sets the signals ICLK(0) and ICLK(1) as the signals ICLKD(1) and ICLKD(0).

Figure 9:
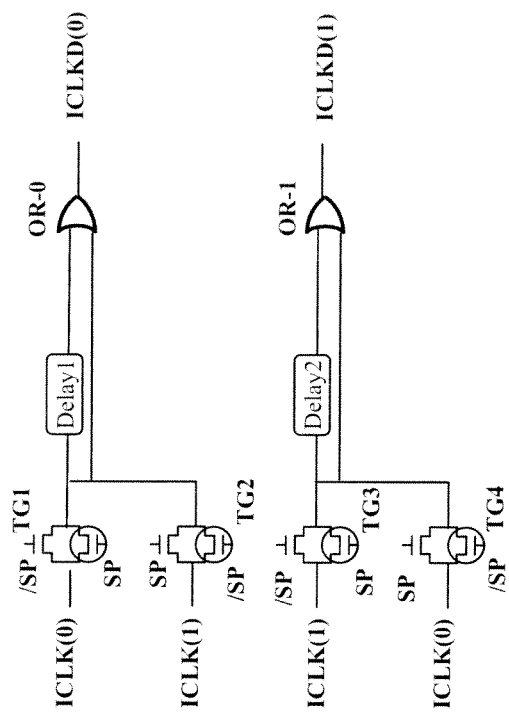
FIG. 9 is a diagram showing a configuration of an ICLK adjustment circuit in the second exemplary embodiment of the present invention.

FIG. 9 is a diagram showing a con figuration of the ICLK adjustment circuit 116 in FIG. 8. The configuration in FIG. 9 is basically the same as that in FIG. 3B. Complementary signals SP and /SP indicating a phase comparison result outputted from the DLL-CK frequency-divided signal phase comparison circuit are used, in place of the signals SET and /SET in FIG. 3B. Referring to FIG. 9, the ICLK adjustment circuit 116 includes a CMOS transfer gate TG1 including NMOS and PMOS transistors having gates supplied with the signals /SP and SP respectively, a CMOS transfer gate TG2 including NMOS and PMOS transistors having gates supplied with the signals SP and /SP respectively, a CMOS transfer gate TG3 including NMOS and PMOS transistors having gates supplied with the signals /SP and SP respectively, and a CMOS transfer gate TG4 including NMOS and PMOS transistors having gates supplied with the signals SP and /SP respectively.

The signals ICLK(0) and ICLK(1) are respectively supplied to the CMOS transfer gates TG1 and TG2. Outputs of the CMOS transfer gates TG1 and TG2 are coupled and then branched into two. One of the branched signals is delayed by a delay circuit (Delay 1) and is then supplied to a first input terminal of a two-input OR circuit OR-0, and the other of the branched signals is supplied directly to a second input terminal of the two-input OR circuit OR-0.

The signals ICLK (1) and ICLK (0) are supplied to the CMOS transfer gates TG3 and TG4. Outputs of the CMOS transfer gates TG3 and TG4 are coupled and then branched into two. One of the branched signals is delayed by a delay circuit (Delay 2) and is then supplied to a first input terminal of a two-input OR circuit OR-1, and the other of the two signals is supplied directly to a second input terminal of the two-input OR circuit OR-1. Delay characteristics of the delay circuits Delay 1 and 2 and the OR circuits OR-0 and OR-1 are set to be the same.

When the signal /SP is High and the signal SP is Low, the CMOS transfer gates TG1 and TG3 are conductive and the CMOS transfer gates TG2 and TG4 are not-conductive. The signal ICLK (0) is outputted as the signal ICLKD (0) with its pulse width extended by an amount corresponding to a delay time of the delay circuit Delay 1, and the signal ICLK (1) is outputted as the signal ICLKD (1) with its pulse width extended by an amount corresponding to a delay time of the delay circuit Delay 2.

When the signal /SP is Low and the signal SP is High, the CMOS transfer gates TG2 and TG4 are conductive and the CMOS transfer gates TG1 and TG3 are not conductive. The signal ICLK (1) is outputted as the signal ICLKD (0) with its pulse width extended by a mount corresponding to the delay time of the delay circuit Delay 1, and the signal ICLK (0) is outputted as the signal ICLKD (1) with its pulse width extended by the amount corresponding to the delay time of the delay circuit Delay 2.

Figure 10:
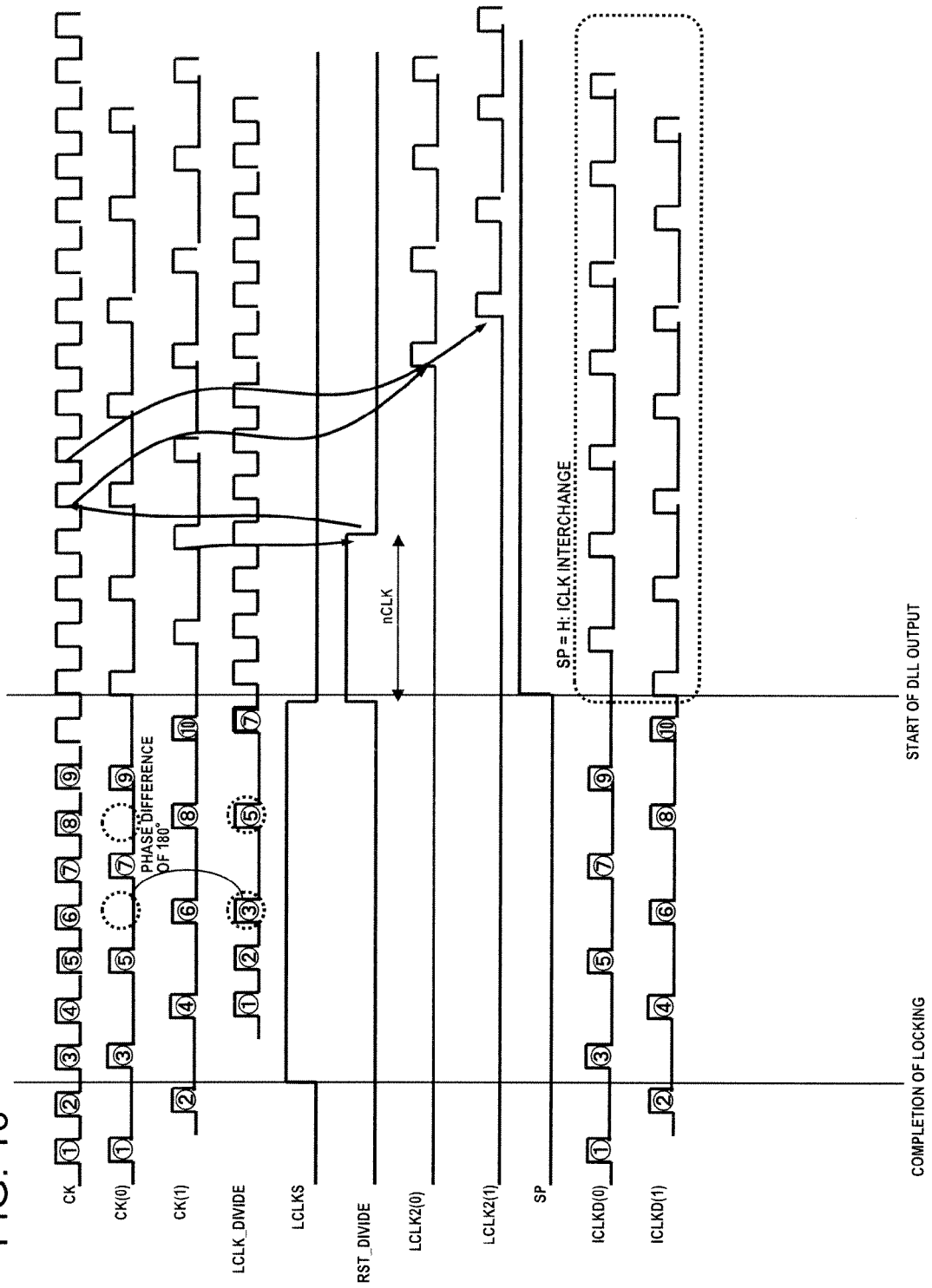
FIG. 10 is a timing diagram illustrating operation of the second exemplary embodiment (when signals ICLK (1:0) are in phase)
Figure 11:
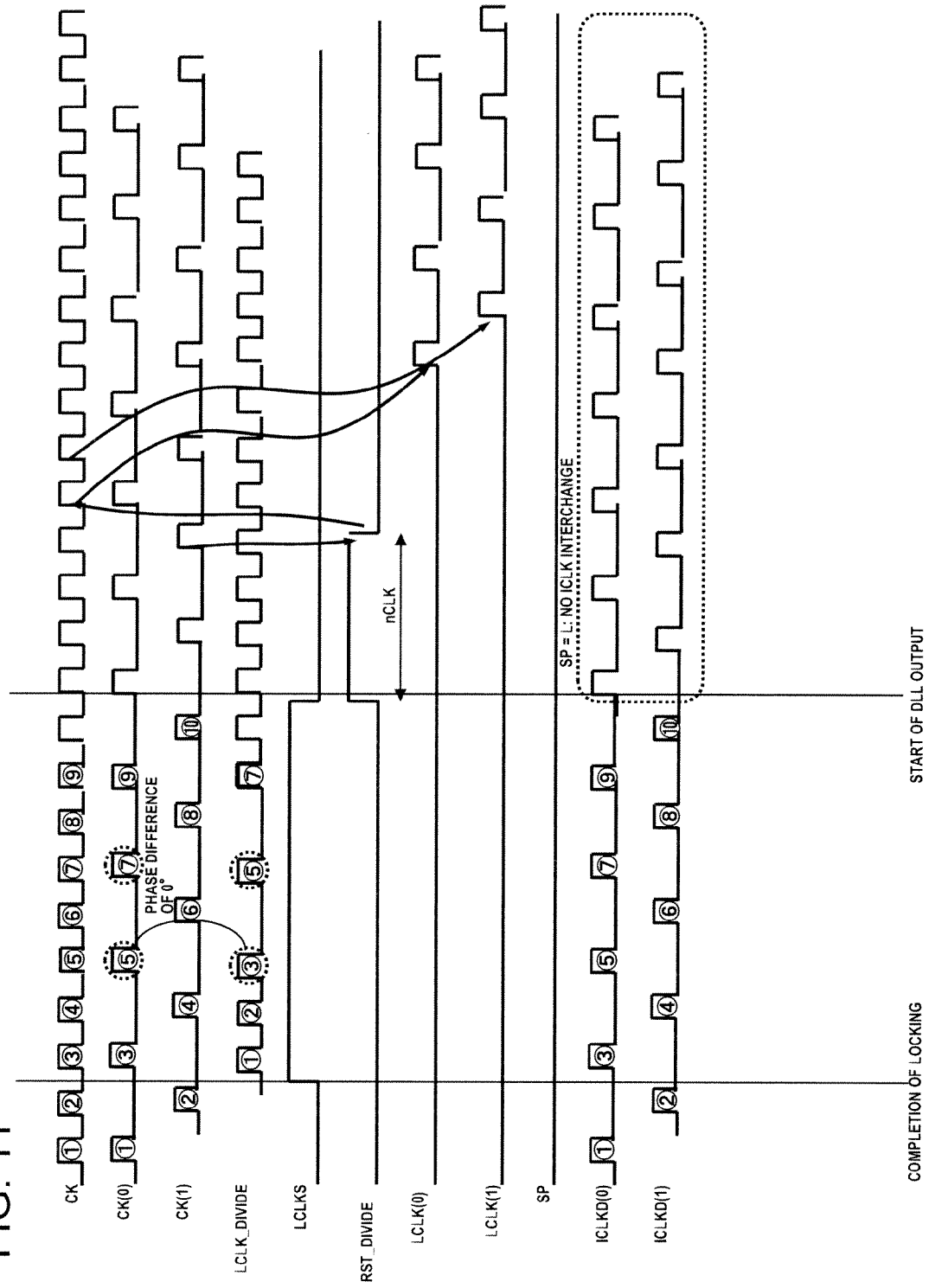
FIG. 11 is a timing diagram illustrating operation of the second exemplary embodiment (when the signals ICLK (1:0) are in opposite phase)

FIGS. 10 and 11 are diagrams for explaining operation examples of the second exemplary embodiment. The following describes a method of phase-aligning the output clock signal of the DLL with the internal clock signal, with reference to FIGS. 8 to 11. FIG. 10 shows a case where the clock LCLK_DIVIDE is in opposite phase with the clock CK(0) (with a phase difference of 180 degrees) (phase comparison result SP=High). FIG. 11 shows a case where the clock LCLK_DIVIDE is in phase with the clock CK(0) (with a phase difference of 0 degrees) (phase comparison result SP=Low).

(A) During a period on the left side (of a vertical line) indicating a timing of "lock completion" of the DLL 100B on each page of FIGS. 10 and 11, a lock sequence of the DLL 100B starts, and the phase detector circuit of the DLL 100B performs delay time control (lock sequence) of the delay element so that a rise timing of the input clock is aligned with a rise timing of the output signal of the DQ replica.

(B) The locking of the DLL 100B is completed, so that the control signal LCLKS is set to High. The CK selector circuit 111 responds to the control signal LCLKS at High level. Then, the DLL 100B receives the clock signal CK(0) (the first-phase signal of the two-phase clocks having the cycle twice as long as the clock signal CK) outputted from the CK control unit 112. The DLL 100B then outputs the divide-by-two clock LCK_DIVIDE synchronized with the clock signal CK(0). Referring to FIG. 10. the DLL 100B outputs pulses (to which the number "3", "5" and "7" are assigned respectively) of the divide-by-two clock LCLK_DIVIDE, in response to input of pulses of the clock signal CK(0) corresponding to third, fifth, and seventh pulses (to which the number "3", "5" and "7" are assigned respectively)of the clock signal CK.

(C) The DLL and CK frequency-divided signal phase comparison circuit 114 makes phase comparison between the frequency-divided clock LCLK_DIVIDE outputted from the DLL 100B and the frequency-divided clock CK(0) from the CK frequency divider circuit 113 (during a period when the control signal LCLKS is High).

In the example schematically shown in FIG. 10, the double-cycle first-phase clock CK (0) is not present in a position that overlaps in time with the pulse (to which the number "3" is assigned) of the divide-by-two clock LCLK_DIVIDE in the DLL and CK frequency signal phase comparison circuit 114. A pulse (to which the number "6" is assigned) of the double-cycle second-phase clock CK(1) is present in the position that overlaps in time with the pulse (to which the number "3" is assigned) of the divide-by-two clock LCLK_DIVIDE. Accordingly, the DLL and CK frequency-divided signal phase comparison circuit 114 determines that the phase of the clock CK (0) is delayed from the phase of the clock CK(1) by 180 degrees with respect to the divide-by-two clock LCLK_DIVIDE, and then sets the phase comparison result SP to High.

(D) After the phase detection, during a period corresponding to several clocks (n clocks) of the clock signal CK, the CK control circuit 112 sends the signal (fixed at Low) via the CLK switching circuit 111 to the DLL 100B.

(E) The control signal LCLKS rises from High to Low in the DLL 100B. The CK selector circuit 111 receives the control signal LCLKS at Low level. The CK selector circuit 111 changes over from the clock CK(0) to the output of the initial stage circuit 100, in response to the Low level of the LCLKS, and the clock CK is supplied to the DLL 100B (the DLL output is started).

(F) The CK control circuit 112 activates the reset signal RST_DIVIDE (High) for the period of the n clocks, in response to the level change of the control signal LCLKS from High to Low. The LCLK frequency divider circuit 118 receives the High level of the RST_DIVIDE and is then reset (the LCLK frequency divider circuit does not perform a frequency-division operation). When the reset signal RST_DIVIDE goes Low, the reset is cancelled, so that the LCLK frequency divider circuit 118 starts frequency-division by two of the clock LCLK1 from the DLL. After the DLL has started output, the CK control circuit 112 sets the reset signal RST_DIVIDE from High to Low, responsive to the rising edge of the double-cycle second-phase clock CK (1). Responsive to the level change of the reset signal RST_DIVIDE to Low, the LCLK frequency divider circuit 118 frequency-divides by two the output LCLK1 of the DLL to generate the double-cycle two-phase clocks LCLK2(0) and LCLK2(1) having the cycle twice as long as the cycle of the output LCLK1 of the DLL.

Referring to FIG. 10, when the clock LCLK_DIVIDE is in opposite phase with the clock CK(0) (with a phase difference of 180 degrees), the DLL and CK frequency-divided signal phase comparison circuit 14 outputs the phase comparison result SP at High level.

When the phase comparison result SP is High, the ICLK adjustment circuit 116 outputs the signal ICLK(1) as the signal ICLKD(0) and outputs the signal ICLK(0) as the signal ICLKD(1).

Referring to FIG. 11 as well, the timing operation steps indicated by reference characters (A) to (F) are performed, as described with reference to FIG. 10. In the step (B), the locking of the DLL 100B is completed, and the control signal LCLKS is set to High. The CK selector circuit 111, responsive to the control signal LCLKS at High level, receives the clock signal CK(0) (the first-phase signal of the two-phase clocks having the cycle twice as long as the clock signal CK) outputted from the CK control unit 112, and then outputs the divide-by-two clock LCK_DIVIDE synchronized with the clock CK(0).

Referring to FIG. 11, the DLL 100B outputs pulses (to which the number "3", "5" and "7" are assigned) of the divide-by-two clock LCLK_DIVIDE, in response to input of pulses of the clock CK(0) corresponding to third, fifth, and seventh pulses (to which the number "3", "5" and "7" are assigned) of the clock CK.

In the step (C), the DLL and CK frequency-divided signal phase comparison circuit 114 makes phase comparison between the frequency-divided clock LCLK_DIVIDE outputted from the DLL 100B and the frequency-divided clock CK(0) from the CK frequency divider circuit 113 (during a period when the control signal LCLKS is High). In the example schematically shown in FIG. 11, pulses (to which the number "5", "7" and "9" are assigned) of the double-cycle first-phase clock CK (0) are respectively present in positions that overlap in time with pulses (to which the number "3", "5" and "7" are assigned) of the divide-by-two clock LCLK_DIVIDE in the DLL and CK frequency-divided phase comparison circuit 114. Accordingly, the DLL and CK frequency-divided signal phase comparison circuit 114 determines that the clock CK (0) and the clock CK(1) are in phase with each other with respect to the clock LCLK_DIVIDE, and sets the phase comparison result SP to Low.

When the phase comparison result SP is High, the ICLK adjustment circuit 116 outputs the signal ICLK(0) as the signal ICLKD(0) and outputs the signal ICLK(1) as the signal ICLKD(1) (with no clock interchange performed as in the period from the lock completion of the DLL to the output start of the DLL).

In this exemplary embodiment as well, the output control signal is generated using the two-phase clocks ICLK (1:0) having the cycle (2tCK) twice as long as the cycle of the internal clock signal, the two-phase clocks LCLK2 (1:0) having the cycle (2tCK) twice as long as the cycle of the output signal of the DLL. and the internal read command signal RCMD. Accordingly, while enlarging a timing margin, stability and an increase in speed of operation with a timing accuracy of tCK can be implemented. Further, phase comparison for determining which one of the clock signals ICLK (0) and ICLK(1) is used as the preceding clock for data (e.g. even-numbered data D0, D1, D2) in terms of a timing is made, using the signals obtained by frequency-divided by two signal of the clock signal CK and the frequency-divided by two signal of the output signal of the DLL. The timing margin is ensured for the comparison operation.

<Third Exemplary Embodiment>

Figure 13:
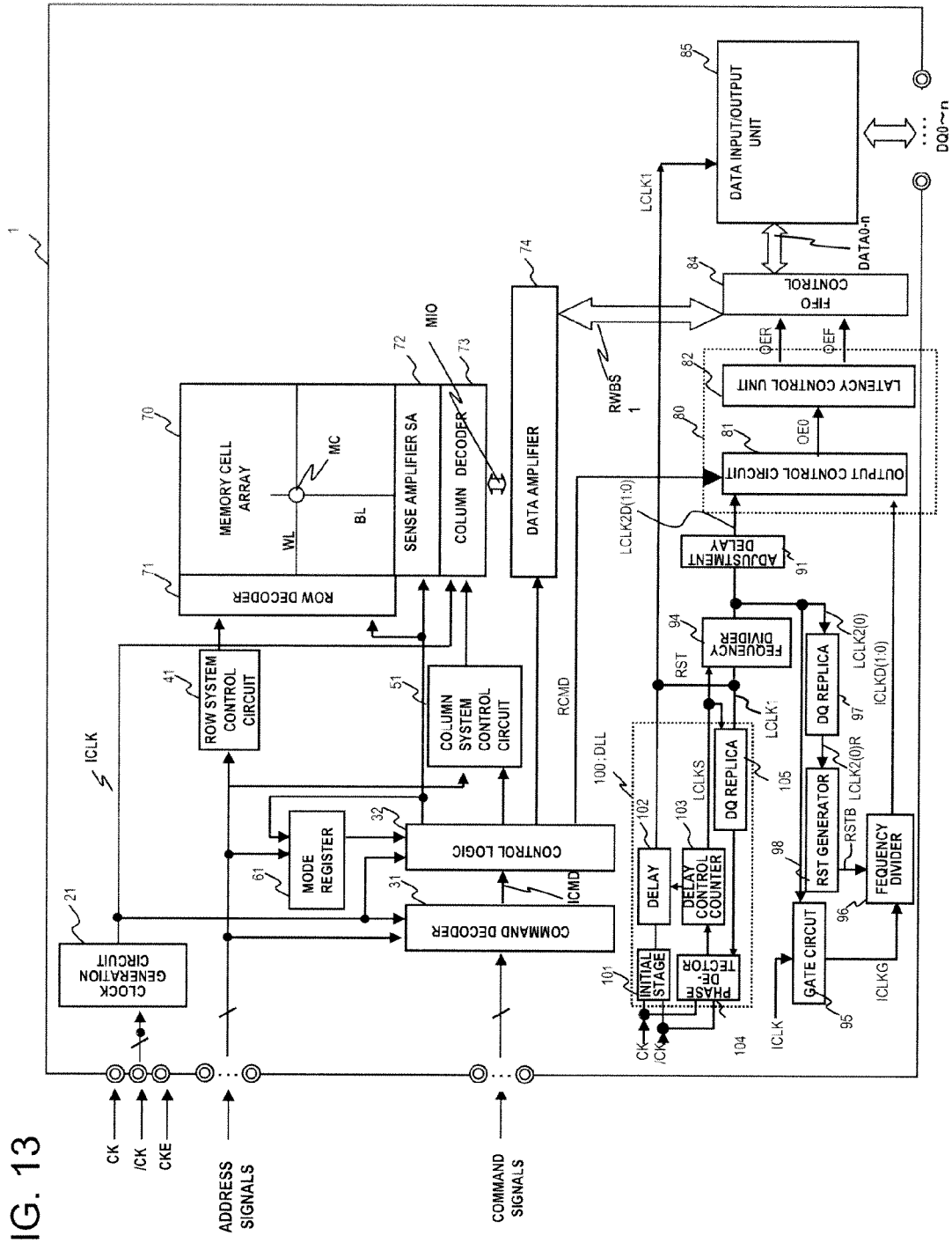
FIG. 13 is a diagram showing a configuration of a third exemplary embodiment of the present invention.

The following described a third exemplary embodiment. FIG. 13 is a diagram showing a configuration of the third exemplary embodiment of the present invention. In FIG. 13, the same or similar elements are designated by the same reference numerals as in FIG. 1, or FIG. 12, and are not described again for brevity. Referring to FIG. 13, in the semiconductor device 1 according to the present embodiment, there are provided an ICLK gate circuit 95, an ICLK frequency divider circuit 96, a DQ replica circuit 97, and a restart signal generation circuit (RST generator) 98. The ICLK gate circuit 95, when it is in an activated slate, supplies the internal clock signal ICLK received, as ICLKG, to the ICLK frequency divider circuit 96. The ICLK gate circuit 95 is activated in accordance with a clock signal LCLK2(0) out of the divided-by-two clock signals LCLK2(1:0) supplied from the LCLK frequency divider circuit 94. Once activated, the ICLK gate circuit 95 maintains its activated state until the DLL circuit 100 is reset. The DQ replica circuit 97, which is designed to have a delay time substantially the same as that of the DQ replica 105 in the DLL circuit 100, receives the clock LCLK2(0) out of the divided-by-two clock signals LCLK2 (1:0) from the LCLK frequency divider circuit 94, and delays the clock signal LCLK2(0) to supply the so delayed clock signal, as a clock signal LCLK2(0)R, to the restart signal generation circuit 98. The restart signal generation circuit 98, in response to the clock signal LCLK2(0)R supplied from the DQ replica circuit 97, generates a restart signal RSTB (Low active) for supply to the ICLK frequency divider circuit 96. The restart signal generation circuit 98 is so adapted that once it has generated the restart signal RSTB, it keeps to stop the generation of the restart signal RSTB until the DLL circuit 100 is reset. The ICLK frequency divider circuit 96 frequency-divides by two the internal clock signal ICLKG outputted from the ICLK gate circuit 95 to generate two-phase internal clock signals ICLKD(1:0). The ICLK frequency divider circuit 96 is initialized by the restart signal RSTB supplied from the restart signal generation circuit 98.

Figure 14:
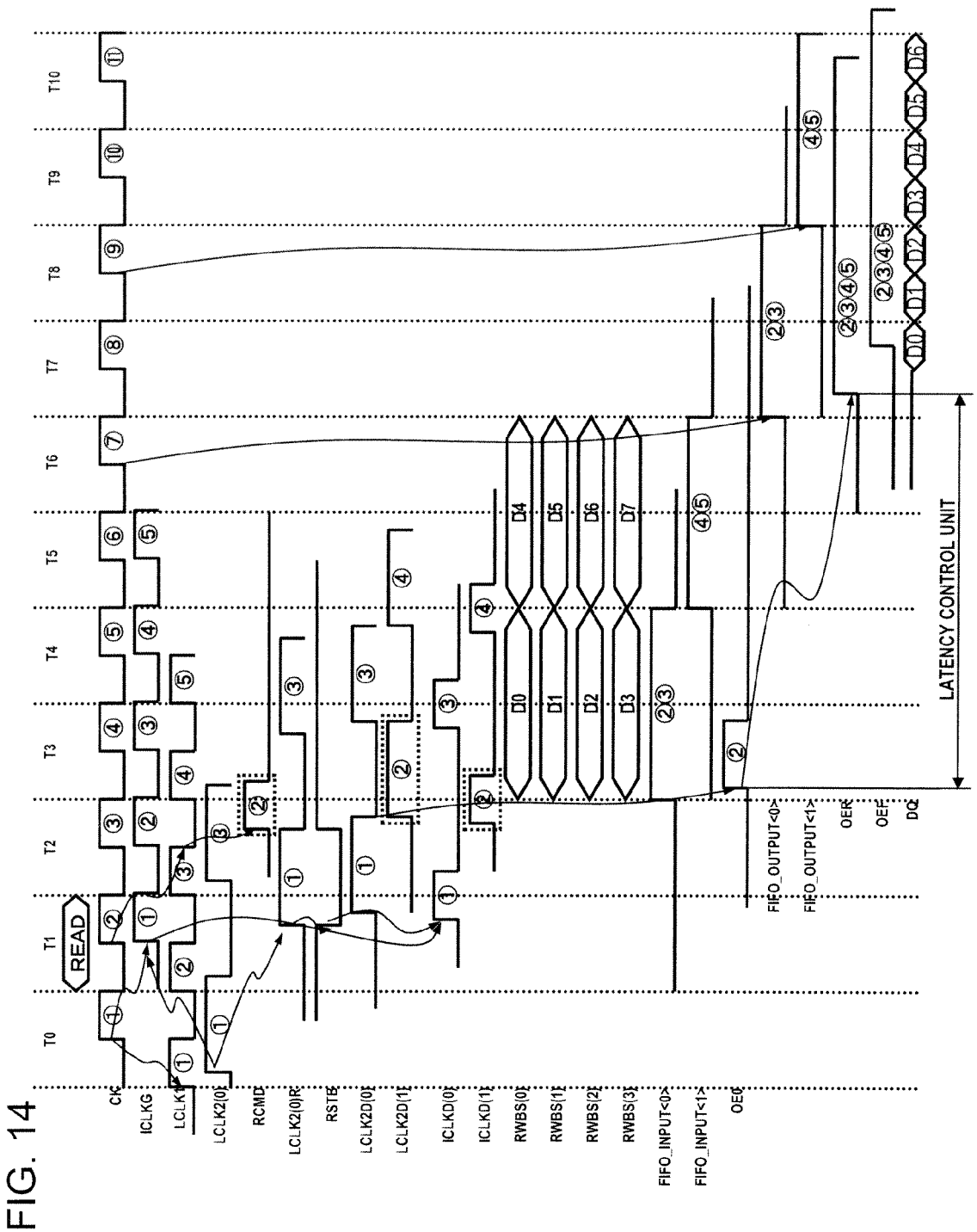
FIG. 14 is a timing diagram illustrating operation of the third exemplary embodiment.

FIG. 14 shows waveforms of signals in FIG. 13. illustrating operation of the present embodiment. A number which is assigned to a High pulse of each signal and enclosed by a circle in the High pulse indicates that the High pulse corresponds to a High pulse number of the external clock signal CK. As shown FIG. 14, clocking of the internal clock signal ICLKG is started, responsive to a first pulse of the clock LCLK2(0) (to which the number "1" is assigned). A first pulse of the clock LCLK2(O)R (to which the number "1" is assigned) is generated, responsive to the first pulse of the clock LCLK2(0). The restart signal RSTB (Low) is generated, responsive to the first pulse of LCLK2(0)R. The ICLK frequency divider circuit 96, after it has been initialized in response to the activation of the restart signal RSTB, generates a first pulse of the internal clock signal ICLKD(O) (to which the number "1" is assigned), responsive to a first pulse of the internal clock signal ICLKG (to which the number "1" is assigned) supplied to the ICLK frequency divider circuit 96, at first after the initialization thereof. The ICLK frequency divider circuit 96 generates a first pulse of the internal clock signal ICLKD(1) (to which the number "2" is assigned) responsive to a second pulse of the internal clock signal ICLKG (to which the number "2" is assigned) which follows the first pulse of the internal clock signal ICLKG. Following this, the ICLK frequency divider circuit 96 generates pulses of the internal clock signals ICLKD(0) and ICLKD(1) alternately in time responsive to a plurality of pulses of the internal clock signal ICLKG. The two phase divide-by-two clock signals LCLK2D(0) and LCLK2D(1) in FIG. 14 correspond to two phase divide-by-two clock signals LCLK2(0) and LCLK2(1) in FIG. 6, respectively. The waveforms or transitions of the other signals are substantially the same as those in FIG. 6 and are not described again for brevity.

In the above described first exemplary embodiment, the double-cycle two-phase clocks are generated from the internal clock signal CLK and the double-cycle two-phase clocks are generated from the clock signal LCLK1 outputted from the DLL. It may also be so configured that (m+1)-phase clocks ICLK (m:0) (m being an integer of two or more, for example) and (m+1)-phase clocks LCLKm+1 (m:0) are generated. The (m+1)-phase clocks ICLK have a cycle which is m times as long as the cycle of the internal clock signal CLK. The (m+1)-phase clocks LCLKm+1 (m:0) have a cycle which is (m+1) times as long as the cycle of the clock signal LCLK1 from the DLL. Then, (m+1) AND circuits may be included in the output control circuit 81. A kth (K: 0 to m) AND circuit may receive the signals RCMD, ICLK(k), and LCLKm(k), and a logical OR operation of the (m+1) AND circuits may be output as the signal OE0.

The output control circuit 81 may be configured to keep the signal OE0 to be active for a period corresponding to the number of clock cycles of the CAS latency.

The same holds true for the second exemplary embodiment as well. The DLL and CK frequency-divided signal phase comparison circuit 114 may compare phases of a clock outputted from the DLL that is frequency-divided by (m+1) and a first-phase clock (CK(0)) of (m+1) phase clocks CK (m:0) having a cycle which is (m+1) times as long as the cycle of the clock signal CK.

Each disclosure of the Patent Document 1 is incorporated herein by reference. Modifications and adjustments of the exemplary embodiments and an example of the present invention are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A device comprising:
   a first clock dividing unit that receives a first clock signal and generates a plurality of second clock signals in response to the first clock signal, the second clock signals being different in phase from each other;
   a second clock dividing unit that receives a third clock signal antecedent in phase to the first clock signal and generates a plurality of fourth clock signals in response to the third clock signal, the fourth clock signals being different in phase from each other, and each of the fourth clock signals being related to an associated one of the second clock signals;
   a first control circuit that generates a first control signal in response to the first clock signal; and
   a second control circuit that receives the second clock signals, the fourth clock signals and the first control signal, and generates a second control signal in response to the first control signal, one of the second clock signals and one of the fourth clock signals that is related to the one of the second clock signals.

2. The device according to claim 1, wherein a cycle of each of the second clock signals is greater in time than a cycle of the first clock signal and a cycle of each of the fourth clock signals is greater in time than a cycle of the third clock signal.

3. The device according to claim 1, wherein each of the fourth clock signals takes an active level thereof during a first period of time that overlaps at least partially with a second period of time when the associated one of the second clock signals takes an active level thereof.

4. The device according to claim 1, wherein each of the second clock signals takes an active level thereof such that a plurality of first periods of time when the second clock signals respectively take the active level thereof are free from overlapping in time to each other, and each of the fourth clock signals takes an active level thereof such that a plurality of second periods of time when the fourth clock signals respectively take the active level thereof are free from overlapping in time to each other.

5. The device according to claim 1, further comprising;
   a first internal clock generator that receives an external clock signal and generates the first clock signal in response to the external clock signal,
   a second internal clock generator that receives the external clock signal and generates the third clock signal in response to the external clock signal, wherein the first clock signal is delayed in phase from the external clock signal and the third clock signal is antecedent in phase to the external clock signal.

6. The device according to claim 5, wherein the second internal clock generator includes a delay locked loop circuit.

7. The device according to claim 5, wherein the second internal clock generator supplies a restart signal to the first clock dividing unit and the first clock dividing unit is reset to be in an initial state thereof in response to the restart signal.

8. The device according to claim 5, wherein the second clock dividing unit includes a divider that receives the third clock signal and generates a plurality of fifth clock signals by dividing the third clock signal and a delay unit that receives the fifth clock signals and generates each of the fourth clock signals by delaying an associated one of the fifth clock signals, the device further comprises a restart generator that produces and supplies a restart signal to the first clock dividing unit in response to one of the fifth clock signals, and the first clock dividing unit is reset to be in an initial state thereof in response to the restart signal.

9. The device according to claim 5, further comprising;
   a memory cell array that stores a plurality of data, and
   an output circuit unit that receives one or ones of data of the memory cell array, outputs the one or ones of data responsive to the second control signal and outputs the one or ones of data in response to the external clock signal.

10. A device comprising:
   a first dividing unit that receives a first clock signal and generates a plurality of second clock signals in response to the first clock signal, the second clock signals being different in phase from each other;
   a second dividing unit that receives a third clock signal antecedent in phase to the first clock signal and generates a plurality fourth clock signals in response to the third clock signal, the fourth clock signals being different in phase from each other;
   a first control circuit that generates a first control signal in response to the first clock signal; and
   a second control circuit that includes a plurality of first circuit portions supplied in common with the first control signal, each of the first circuit portions that receives an associated one of the second clock signals and an associated one of the fourth clock signals and that performs a first logic operation on the first control signal, the associated one of the second clock signals and the associated one of the fourth clock signals to produce a second control signal, and the second control circuit further including a second circuit portion that receives second control signals supplied from the first circuit portions and performs a second logic operation on the second control signals to produce a third control signal.

11. The device according to claim 10, wherein a cycle of each of the second clock signals is greater in time than a cycle of the first clock signal and a cycle of each of the fourth clock signals is greater in time than a cycle of the third clock signal.

12. The device according to claim 10, wherein each of the fourth clock signals takes an active level thereof during a first period of time that overlaps at least partially with a second period of time when the associated one of the second clock signals takes an active level thereof.

13. The device according to claim 10, wherein each of the second clock signals takes an active level thereof such that a plurality of first periods of time when the second clock signals respectively take the active level thereof are free from overlapping in time to each other, and each of the fourth clock signals takes an active level thereof such that a plurality of second periods of time when the fourth clock signals respectively take the active level thereof are free from overlapping in time to each other.

14. The device according to claim 10, further comprising;
a first internal clock generator that receives an external clock signal and generates the first clock signal in response to the external clock signal; and
a second internal clock generator that receives the external clock signal and generates the third clock signal in response to the external clock signal, wherein the first clock signal is delayed in phase from the external clock signal and the third clock signal is antecedent in phase to the external clock signal.

15. The device according to claim 14, wherein the second clock dividing unit includes a divider that receives the third clock signal and generates a plurality of fifth clock signals by dividing the third clock signal and a delay unit that receives the fifth clock signals and generates each of the fourth clock signals by delaying an associated one of the fifth clock signals, the device further comprises a restart generator that produces and supplies a restart signal to the first clock dividing unit in response to one of the fifth clock signals, and the first clock dividing unit is reset to be in an initial state thereof in response to the restart signal.

16. A device comprising:
a first clock generation circuit that receives an external clock signal supplied to the device, delays the external clock signal to output a first clock signal synchronized with the external clock signal; and
a circuit that generates a control signal to control output of data, based on a plurality of second clock signals obtained by frequency-dividing an internal clock signal generated from the external clock signal, and a plurality of third clock signals obtained by frequency-dividing the first clock signal generated by the first clock generation circuit,
wherein the first clock generation circuit delays the external clock signal by a variable delay element to output the first clock signal, and adjusts a delay time of the variable delay element to make a fourth clock signal obtained by delaying the first clock signal and the external clock signal phase-aligned; and
wherein the circuit comprises:
an adjustment circuit that receives the plurality of the second clock signals and the fourth clock signal, determines a phase relationship between each of the plurality of the second clock signals and the fourth clock signal, interchanges an order of the plurality of the second clock signals according to a result of the determination, and outputs a plurality of first adjusted clock signals; and a control circuit that generates a first output control signal based on a logical operation on each of the first adjusted clock signals, one of the third clock signals corresponding to the first adjusted clock signal, and an internal command signal instructing data output, and that generates from the first output control signal a plurality of the control signals to control output of a plurality of data.

17. The device according to claim 16, wherein
the circuit further comprises:
a second clock generation circuit that receives the external clock signal to generate the internal clock signal;
a first frequency divider circuit that frequency-divides the internal clock signal to generate the plurality of the second clock signals; and
a second frequency divider circuit that frequency-divides the first clock signal to generate the plurality of the third clock signals.

18. The device according to claim 17, wherein the first clock generation circuit includes an unlocked state before the external clock signal and the fourth clock signal are phase-aligned and a locked state where the external clock signal and the fourth clock signal are phase-aligned; and
the adjustment circuit determines the phase relationship between each of the second clock signals and the fourth clock signal when the first clock generation circuit is in the locked state.

19. The device according to claim 18, wherein
the first frequency divider circuit frequency-divides by n (n being an integer of two or more) the internal clock signal to generate the second clock signals of n phases mutually spaced by a time corresponding to one cycle of the internal clock signal and having the cycle n times as long a cycle of the internal clock signal; and
the second frequency divider circuit frequency-divides by n the first clock signal to generate the third clock signals of n phases mutually spaced by a time corresponding to one cycle of the internal clock signal and having a cycle n times as long as a cycle of the first clock signal.

20. The device according to claim 19, wherein
the adjustment circuit determines whether or not respective clock pulses of first to n phases of the second clock signals are arranged in order with respect to the fourth clock signal, and interchanges an order of the second clock signals when the second clock signals are not in order, to output the clock pulses of the first to n phases of the second clock signals in order with respect to the fourth clock signal.

* * * * *